US008415174B2

(12) United States Patent
Tanaka

(10) Patent No.: US 8,415,174 B2
(45) Date of Patent: Apr. 9, 2013

(54) INSPECTION METHOD AND MANUFACTURING METHOD OF LIGHT-EMITTING DEVICE

(75) Inventor: Koichiro Tanaka, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 335 days.

(21) Appl. No.: 12/841,394

(22) Filed: Jul. 22, 2010

(65) Prior Publication Data
US 2011/0027918 A1 Feb. 3, 2011

(30) Foreign Application Priority Data

Jul. 28, 2009 (JP) ................................ 2009-175377

(51) Int. Cl.
H01L 21/66 (2006.01)
(52) U.S. Cl.
USPC .... 438/4; 438/16; 257/E21.527; 257/E33.043
(58) Field of Classification Search ............ 257/E33.043
See application file for complete search history.

(56) References Cited

U.S. PATENT DOCUMENTS

| 4,739,414 | A | 4/1988 | Pryor et al. |
| 5,943,346 | A | 8/1999 | Sanada |
| 6,049,167 | A | 4/2000 | Onitsuka et al. |
| 6,127,363 | A | 10/2000 | Doherty et al. |
| 6,171,961 | B1 | 1/2001 | Yamazaki et al. |
| 6,232,248 | B1 | 5/2001 | Shinriki et al. |
| 6,312,526 | B1 | 11/2001 | Yamamuka et al. |
| 6,333,065 | B1 | 12/2001 | Arai et al. |
| 6,338,979 | B1 | 1/2002 | Tanaka et al. |
| 6,420,031 | B1 | 7/2002 | Parthasarathy et al. |
| 6,512,385 | B1 | 1/2003 | Pfaff et al. |
| 6,590,335 | B1 | 7/2003 | Nagayama |
| 6,641,933 | B1 | 11/2003 | Yamazaki et al. |

(Continued)

FOREIGN PATENT DOCUMENTS

| EP | 1 021 070 | 7/2000 |
| JP | 2002-260857 | 9/2002 |

(Continued)

OTHER PUBLICATIONS

International Search Report (Application No. PCT/JP2010/061569) Dated Oct. 12, 2010.
Written Opinion (Application No. PCT/JP2010/061569) Dated Oct. 12, 2010.

Primary Examiner — Stephen W Smoot
(74) Attorney, Agent, or Firm — Eric J. Robinson; Robinson Intellectual Property Law Office, P.C.

(57) ABSTRACT

In a light-emitting element provided with a thick layer of a plurality of EL layers which are partitioned by a charge generation layer between a pair of electrodes, a portion which a conductive foreign substance enters between the pair of electrodes emits stronger light at a voltage lower than a voltage required when a normal portion starts emitting light. In a light-emitting element provided with a plurality of EL layers which are partitioned by a charge generation layer between a pair of electrodes, a voltage may be applied thereto in the forward direction. Then, an abnormal light-emission portion may be detected because the portion emits light at a luminance of 1 (cd/m$^2$) or higher when the applied voltage is lower than a voltage required when a normal portion starts emitting light. The portion may be irradiated with laser light so as to be insulated.

17 Claims, 13 Drawing Sheets

U.S. PATENT DOCUMENTS

| | | |
|---|---|---|
| 6,673,643 B2 | 1/2004 | Yamazaki |
| 6,777,710 B1 | 8/2004 | Koyama |
| 6,830,494 B1 | 12/2004 | Yamazaki et al. |
| 6,909,111 B2 | 6/2005 | Yamagata et al. |
| 7,163,854 B2 | 1/2007 | Yamazaki et al. |
| 7,871,930 B2 | 1/2011 | Yamagata et al. |
| 8,273,583 B2 | 9/2012 | Yamagata et al. |
| 2003/0189401 A1 | 10/2003 | Kido et al. |
| 2005/0196892 A1 | 9/2005 | Yamagata et al. |
| 2007/0182317 A1 | 8/2007 | Kido et al. |
| 2008/0136325 A1 | 6/2008 | Yamazaki et al. |
| 2011/0136266 A1 | 6/2011 | Yamagata et al. |

FOREIGN PATENT DOCUMENTS

| | | |
|---|---|---|
| JP | 2003-272860 | 9/2003 |
| JP | 2005-083951 | 3/2005 |
| JP | 2007-042492 | 2/2007 |
| JP | 2007-042498 | 2/2007 |
| WO | WO-2006/093171 | 9/2006 |

INSPECTION METHOD AND MANUFACTURING METHOD OF LIGHT-EMITTING DEVICE

TECHNICAL FIELD

The present invention relates to an inspection method for detecting a potential defect in a light-emitting device, and a manufacturing method of the light-emitting device in which the potential defect is insulated.

BACKGROUND ART

In recent years, research and development have been extensively conducted on light-emitting elements using electroluminescence (hereinafter also referred to as EL). Such a light-emitting element has a structure where a layer including a light-emitting substance is interposed between a pair of electrodes. By applying a voltage between the pair of electrodes, light emission can be obtained from the light-emitting substance.

The light-emitting element using electroluminescence has great characteristics which are advantageous in that it can be manufactured to be thin and lightweight and has very high response speed, for example. There are various possible applications of such a self-luminous light-emitting element. For example, such a light-emitting element is preferably used for a flat panel display because of having characteristics such that the pixels have higher visibility as compared to a liquid crystal display and no backlight is required.

Since the light-emitting element can be formed into a film shape, surface light emission from a large area can be readily obtained. This characteristic is difficult to be obtained by using a point light source typified by an incandescent lamp or an LED (light emitting diode), or a linear light source typified by a fluorescent lamp. Therefore, the light-emitting element has a high utility value as a surface light source that can be applied to illumination or the like.

The light-emitting element using electroluminescence is roughly classified in accordance with whether it includes an organic compound or an inorganic compound as a light-emitting substance. Now a principle of light emission of the light-emitting element which includes an organic compound as a light-emitting substance will be described. First, by applying a voltage between a pair of electrodes of the light-emitting element, electrons and holes are separately injected from the pair of electrodes into a layer including a light-emitting organic compound. Those carriers (the electrons and holes) are recombined, and then the light-emitting organic compound is excited. The light-emitting organic compound emits light when it returns to a ground state from the excited state.

An EL layer of a light-emitting element using electroluminescence is very thin. The EL layer is so thin that a pair of electrodes of the light-emitting element is easily short-circuited in the case where a conductive foreign substance enters between the pair of electrodes of the light-emitting element. The short circuit results in failures such as breakages of the light-emitting element, deterioration of the light-emitting element due to heat generation, and increase of power consumption due to leakage current.

Therefore, a method and a device for detecting defects in a light-emitting element using electroluminescence and for irradiating the defects with laser light so that the defects are insulated have been proposed (e.g., Patent Document 1).

Meanwhile, the density of current flowing through the EL layer may be increased in order to increase emission luminance of a light-emitting element using electroluminescence. However, when the driving voltage is increased in order that large current flows, power consumption is increased more and more. Additionally, large current flowing through the EL layer causes the light-emitting element to deteriorate more quickly.

Therefore, a light-emitting element in which a plurality of EL layers are stacked is proposed. Patent Document 2 discloses a light-emitting element in which a plurality of light-emitting units (hereinafter in this specification, the light-emitting unit is also referred to as an EL layer) are included and the light-emitting units are each partitioned by a charge generation layer which supplies carriers to the EL layers, as well as electrodes. In this specification, the charge generation layer is assumed to be equivalent to the electrode, and a region which is interposed between the charge generation layers adjacent to each other or between the charge generation layer and one of the electrodes adjacent to each other is counted as one EL layer. More specifically, Patent Document 2 discloses a light-emitting element in which a charge generation layer formed using vanadium pentoxide is provided over a metal-doped layer which functions as an electron injection layer of a first light-emitting unit, and further a second light-emitting unit is provided over the charge generation layer. The light-emitting element disclosed in Patent Document 2 can emit light at a luminance higher than a light-emitting element provided with one EL layer, when current with the same current density is supplied to each of these light-emitting elements. Additionally, the light-emitting element disclosed in Patent Document 2 can emit light at the same luminance as the light-emitting element provided with one EL layer, with lower power consumption.

REFERENCE

[Patent Document 1] Japanese Published Patent Application No. 2002-260857
[Patent Document 2] Japanese Published Patent Application No. 2003-272860

DISCLOSURE OF INVENTION

A stack film formed in such a manner that a plurality of EL layers are partitioned by a charge generation layer or an intermediate layer is thicker than that of a light-emitting element provided with one EL layer. As compared to the light-emitting element provided with one EL layer, the light-emitting element provided with the thick stack film between a pair of electrodes is not easily short-circuited even when a conductive foreign substance enters between the pair of electrodes. However, a portion which a conductive foreign substance enters is a potential defect; therefore, the portion emits light abnormally. Additionally, there is a concern that failures might be apparent which cause, for example, large variation in characteristics and a short circuit due to use for a long time.

A conventional method for detecting an apparent defect has a problem in that it is difficult to detect such a potential defect.

The present invention is made in view of the foregoing technical background. Therefore, one object is to provide a method for detecting a potential defect which has not caused a short circuit in a light-emitting element provided with a plurality of EL layers which are partitioned by a charge generation layer or an intermediate layer between a pair of electrodes; in other words, the light-emitting element where two or more of the EL layers and the charge generation layer (or the intermediate layer) are alternately stacked between the pair of electrodes. Another object is to provide a method for manufacturing a light-emitting device by insulating the potential defect.

In a light-emitting element provided with a stack film including a plurality of EL layers which are partitioned by a charge generation layer between a pair of electrodes, a portion which a conductive foreign substance enters emits stronger light at a voltage lower than the voltage required for light emission at a normal portion. In other words, in the light-emitting element where two or more of the EL layers and the charge generation layer are alternately stacked between the pair of electrodes, a portion which a conductive foreign substance enters emits stronger light at a voltage lower than the voltage required for light emission at a normal portion.

Consequently, in a light-emitting element provided with a plurality of EL layers which are partitioned by a charge generation layer between a pair of electrodes; in other words, the light-emitting element where two or more of the EL layers and the charge generation layer are alternately stacked between the pair of electrodes, a voltage is applied thereto in the forward direction. Consequently, a potential defect portion can be detected in such a manner that the portion which starts emitting light at a voltage lower than the voltage required for light emission at a normal portion is detected. Then, the portion which starts emitting light at the above voltage may be irradiated with laser light so as to be insulated.

That is, according to one embodiment of the present invention, a method for inspecting a light-emitting element provided with a plurality of EL layers which are partitioned by a charge generation layer between a pair of electrodes, includes the steps of: applying a voltage, which is lower than a light-emission start voltage at which a substantially entire surface of the light-emitting element, through which light is extracted, emits light at a luminance of 1 ($cd/m^2$) or higher, to the light-emitting element in a forward direction; and detecting an abnormal light-emission portion which emits light at a luminance of 1 ($cd/m^2$) or higher in the surface of the light-emitting element, through which light is extracted.

In addition, according to one embodiment of the present invention, a method for inspecting a light-emitting element provided with a plurality of EL layers any one of which emits light of a different color from the other EL layers, which are partitioned by a charge generation layer between a pair of electrodes, includes the steps of: applying a voltage, at which a substantially entire surface of the light-emitting element, through which light is extracted, emits light at a luminance of 1 ($cd/m^2$) or higher, to the light-emitting element in a forward direction; and detecting an abnormal light-emission portion which has different chromaticity in the surface of the light-emitting element, through which light is extracted.

According to one embodiment of the present invention, a method for manufacturing a light-emitting element provided with a plurality of EL layers which are partitioned by a charge generation layer between a pair of electrodes, includes the steps of: applying, in a forward direction, a voltage lower than a light-emission start voltage at which a substantially entire surface of the light-emitting element, through which light is extracted, emits light at a luminance of 1 ($cd/m^2$) or higher; and irradiating, with laser light for insulating the portion, an abnormal light-emission portion which exhibits light emission at a luminance of 1 ($cd/m^2$) or higher in the surface of the light-emitting element, through which light is extracted.

According to one embodiment of the present invention, a method for manufacturing a light-emitting element provided with a plurality of EL layers which are partitioned by a charge generation layer between a pair of electrodes, includes the steps of: applying, in a forward direction, a voltage at which a substantially entire surface of the light-emitting element, through which light is extracted, emits light at a luminance of 1 ($cd/m^2$) or higher; and irradiating, with laser light for insulating the portion, an abnormal light-emission portion which has different chromaticity in the surface of the light-emitting element, through which light is extracted.

According to one embodiment of the present invention, a method for manufacturing a light-emitting element provided with a plurality of EL layers which are partitioned by a charge generation layer between a pair of electrodes, includes the steps of: detecting the abnormal light-emission portion using one of the above-described methods; and irradiating the abnormal light-emission portion with laser light, where a resolution of an observed image in the step of laser irradiation is higher than a resolution of an observed image in the step of detecting the abnormal light-emission portion.

According to one embodiment of the present invention, a method for manufacturing a light-emitting element provided with a plurality of EL layers which are partitioned by a charge generation layer between a pair of electrodes, includes the steps of: detecting the abnormal light-emission portion using one of the above-described methods; and irradiating the abnormal light-emission portion with laser light, where a resolution of an observed image in the step of laser irradiation is 100 to 10,000 times, inclusive, higher than a resolution of an observed image in the step of detecting the abnormal light-emission portion.

Note that, in this specification, a layer of a light-emitting element using electroluminescence, which is partitioned by the electrodes, the intermediate layers, or the electrode and the intermediate layer, and is provided at least with a light-emitting substance is referred to as an EL layer.

In this specification, a layer which is formed in contact with two EL layers therebetween and which functions to inject holes into one of the EL layers and inject electrons into the other of the EL layers is referred to as an intermediate layer. Therefore, a charge generation layer is also called one embodiment of the intermediate layer. Note that the intermediate layer may be a single layer or a plurality of layers.

In this specification, a voltage applied to the light-emitting element at which a substantially entire surface of a light-emitting element, through which light is extracted, emits light at a luminance of 1 ($cd/m^2$) or higher is referred to as a light-emission start voltage.

In this specification, in the case where a substance A is dispersed in a matrix formed using a substance B, the substance B which forms the matrix is referred to as a host material, and the substance A which is dispersed in the matrix is referred to as a guest material. Note that the substance A and the substance B may each be a single substance or a mixture of two or more kinds of substances.

Note that a light-emitting device in this specification means an image display device or a light source (including an illumination device). In addition, the light-emitting device includes any of the following modules in its category: a module in which a connector such as an FPC (flexible printed circuit), a TAB (tape automated bonding) tape, or a TCP (tape carrier package) is attached to a light-emitting device; a module having a TAB tape or a TCP provided with a printed wiring board at the end thereof; and a module having an IC (integrated circuit) directly mounted by a COG (chip on glass) method over a substrate over which a light-emitting element is formed.

According to one embodiment of the present invention, it is possible to provide a method for detecting a potential defect which has not caused a short circuit in a light-emitting element provided with a plurality of EL layers which are partitioned by a charge generation layer between a pair of electrodes. Additionally, it is possible to provide a method for manufacturing a light-emitting device by insulating the potential defect, and a manufacturing apparatus of a light-emitting device using the manufacturing method.

BEST MODE FOR CARRYING OUT THE INVENTION

Figure 1A:
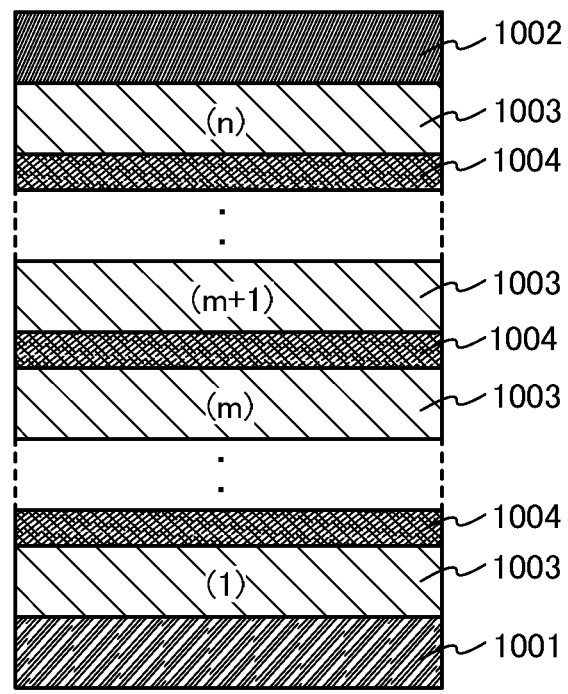
FIGS. 1A and 1B each illustrate a structure of a light-emitting element according to an embodiment.

Embodiments are described in detail with reference to the accompanying drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that, in the structures of the invention described below, the same portions or portions having similar functions are denoted by the same reference numerals in different drawings, and the descriptions of such portions are not repeated.

Embodiment 1

In this embodiment, a method for detecting a potential defect which has not resulted in a short circuit that occurs in a light-emitting element provided with a plurality of EL layers which are partitioned by a charge generation layer between a pair of electrodes will be described.

A light-emitting element provided with a plurality of EL layers which are partitioned by a charge generation layer between a pair of electrodes is described with reference to FIG. 1A. The light-emitting element includes a first electrode 1001, a second electrode 1002, n EL layers 1003 (n is a natural number of 2 or more) between both of the electrodes, and a charge generation layer 1004 between an m-th EL layer (m is a natural number: $1 \leq m \leq n-1$) and a (m+1)-th EL layer.

At least one of the first electrode 1001 and the second electrode 1002 is formed using a light-transmitting conductive film.

Figure 2A:
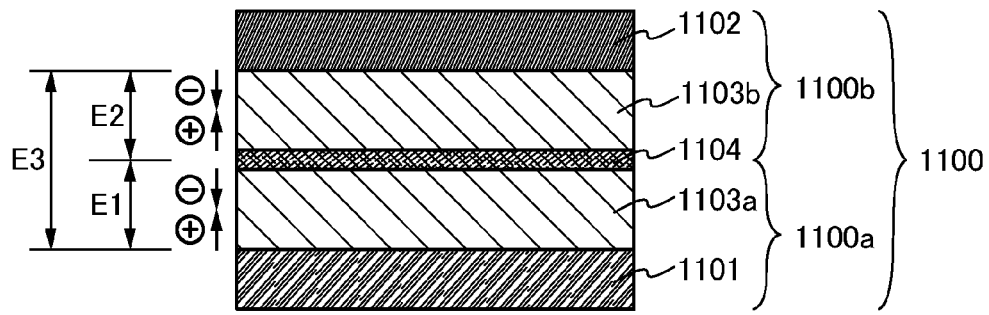
FIG. 2A and FIGS. 2B and 2C each illustrate a structure of a light-emitting element according to an embodiment.

A light-emitting mechanism of a light-emitting element provided with a plurality of EL layers which are partitioned by a charge generation layer between a pair of electrodes is described. Here, the mechanism is described using a light-emitting element 1100 provided with two EL layers which are partitioned by a charge generation layer between a pair of electrodes illustrated in FIG. 2A.

The light-emitting element 1100 includes a first EL layer 1103a, a second EL layer 1103b, a charge generation layer 1104, a first electrode 1101, and a second electrode 1102. One surface of the first EL layer 1103a is in contact with the first electrode 1101, and the other surface thereof is in contact with the charge generation layer 1104. The charge generation layer 1104 is provided between the first EL layer 1103a and the second EL layer 1103b. One side of the second EL layer 1103b is in contact with the charge generation layer 1104, and the other side thereof is in contact with the second electrode 1102.

In the light-emitting element 1100, a voltage $E_3$ is applied so that the first electrode 1101 has an electric potential higher than the second electrode 1102. That is, the first electrode 1101 functions as an anode, and the second electrode 1102 functions as a cathode. When a voltage high enough is applied, holes injected from the first electrode 1101 are recombined with electrons injected from the charge generation layer 1104 in the first EL layer 1103a, whereby the generated energy makes a light-emitting substance in the first EL layer 1103a emit light. In the second EL layer 1103b, holes injected from the charge generation layer 1104 are recombined with electrons injected from the second electrode 1102, whereby the generated energy makes a light-emitting substance in the second EL layer 1103b emit light.

Light which the first EL layer 1103a emits and light which the second EL layer 1103b emits are extracted from one of or both the first electrode 1101 and the second electrode 1102 which is formed using a light-transmitting conductive film. For example, in the case where only the first electrode 1101 is a light-transmitting electrode, emitted light is extracted through the first electrode 1101. Alternatively, in the case where only the second electrode 1102 is a light-transmitting electrode, emitted light is extracted through the second electrode 1102. Furthermore, in the case where both the first electrode 1101 and the second electrode 1102 have light-transmitting electrodes, emitted light is extracted through both the first electrode 1101 and the second electrode 1102.

Next, the characteristics of a light-emitting element provided with one EL layer between a pair of electrodes and a light-emitting element provided with a plurality of EL layers which are partitioned by a charge generation layer between a pair of electrodes are described in comparison.

Figure 3A:
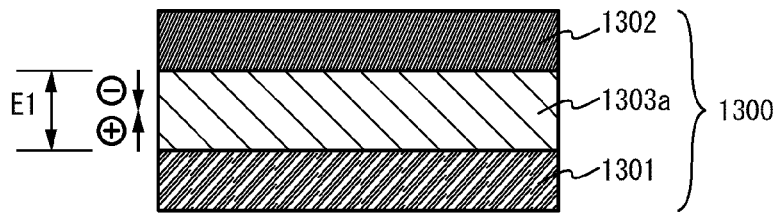
FIGS. 3A to 3C each illustrate a light-emitting element according to an embodiment.

A structure of a light-emitting element 1300 provided with one EL layer between a pair of electrodes is illustrated in FIG. 3A. The light-emitting element 1300 includes a first electrode 1301, a second electrode 1302, and an EL layer 1303a containing a light-emitting organic compound.

Figure 3B:
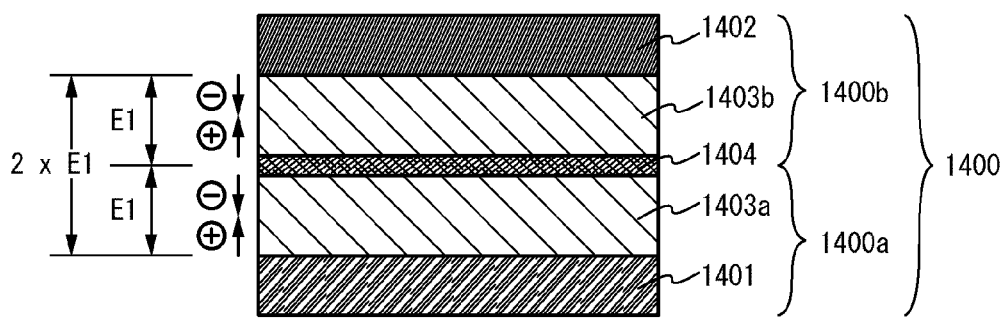

A structure of a light-emitting element 1400 provided with two EL layers which are partitioned by a charge generation layer between a pair of electrodes is illustrated in FIG. 3B. The light-emitting element 1400 includes a first electrode 1401, a second electrode 1402, EL layers 1403a and 1403b containing a light-emitting organic compound, and a charge generation layer 1404. Here, the case where the EL layers

1403*a* and 1403*b* are EL layers which have the same structures as the EL layer 1303*a* included in the light-emitting element 1300 is described. It is needless to say that the EL layers 1403*a* and 1403*b* of the light-emitting element 1400 has the different structure from each other.

In the light-emitting element 1400, each of a first region 1400*a* where the EL layer 1403*a* is sandwiched between the first electrode 1401 and the charge generation layer 1404 and a second region 1400*b* where the EL layer 1403*b* is sandwiched between the charge generation layer 1404 and the second electrode 1402 can be considered as an independent light-emitting element. In other words, the light-emitting element 1400 is formed in such a manner that the first region 1400*a* and the second region 1400*b* are connected in series.

Figure 3C:
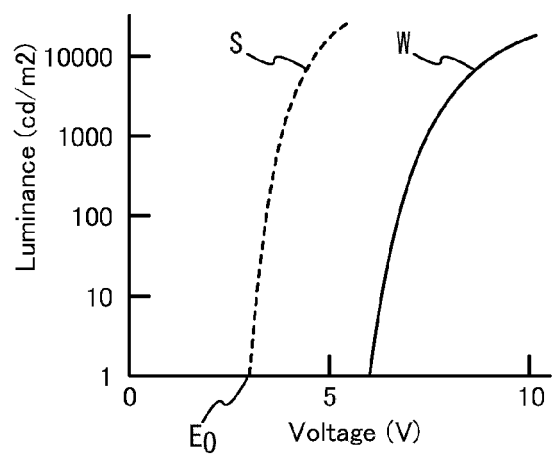

An example of voltage-luminance characteristics of the light-emitting element 1300 is shown by a curve S of FIG. 3C. The emission luminance of the light-emitting element 1300 in which one EL layer is provided between a pair of the electrodes increases rapidly when a voltage higher than a light-emission start voltage $E_0$ is applied thereto. The element having the characteristic shown by the curve S in FIG. 3C emits light at a luminance of 1 (cd/m$^2$) when the light-emission start voltage $E_0$ is applied thereto, and the luminance increases up to about 10,000 (cd/m$^2$) when a voltage twice as high as the light-emission start voltage $E_0$ is applied. Note that, in the case where a light-emitting element using electroluminescence where an organic compound is used as the light-emitting substance emits visible light, a light-emission start voltage $E_0$ is required to be at least about 2 (V).

An example of voltage-luminance characteristics of the light-emitting element 1400 is shown by a curve W of FIG. 3C. The voltage-luminance characteristics of the light-emitting element 1400 (curve W) is shifted to high voltage side as compared to the voltage-luminance characteristics of the light-emitting element 1300 (curve S). For example, in the case where the EL layers 1403*a* and 1403*b* are EL layers which have the same structures as the EL layer 1303*a* included in the light-emitting element 1300, the light-emitting element 1400 can be considered as an element formed in such a manner that the light-emitting elements 1300 are connected in series. Therefore, when a voltage twice as high as the light-emission start voltage $E_0$ of the light-emitting element 1300 is applied to the light-emitting element 1400, each of the EL layers 1403*a* and 1403*b* emits light at a luminance of 1 (cd/m$^2$) and the light-emitting element 1400 emits light at a luminance of about 2 (cd/m$^2$).

That is, the light-emitting element 1400 emits light at a luminance of 2 (cd/m$^2$) while the light-emitting element 1300 emits light at a luminance of 10,000 (cd/m$^2$), when the voltage twice as high as the light-emission start voltage $E_0$ of the light-emitting element 1300 is applied thereto. As described above, there is a great difference in applied voltage-emission luminance characteristics between a light-emitting element provided with one EL layer between a pair of the electrodes and a light-emitting element provided with a plurality of EL layers which are partitioned by a charge generation layer between a pair of electrodes.

Note that the amount of current flowing when a voltage twice as high as the light-emission start voltage $E_0$ of the light-emitting element 1300 is applied to the light-emitting element 1400 is almost the same as that of current flowing when the light-emission start voltage $E_0$ is applied to the light-emitting element 1300. Therefore, the light-emitting element 1400 has an effect of making current efficiency in light emission almost twice as high as that of the light-emitting element 1300.

Figure 2B:
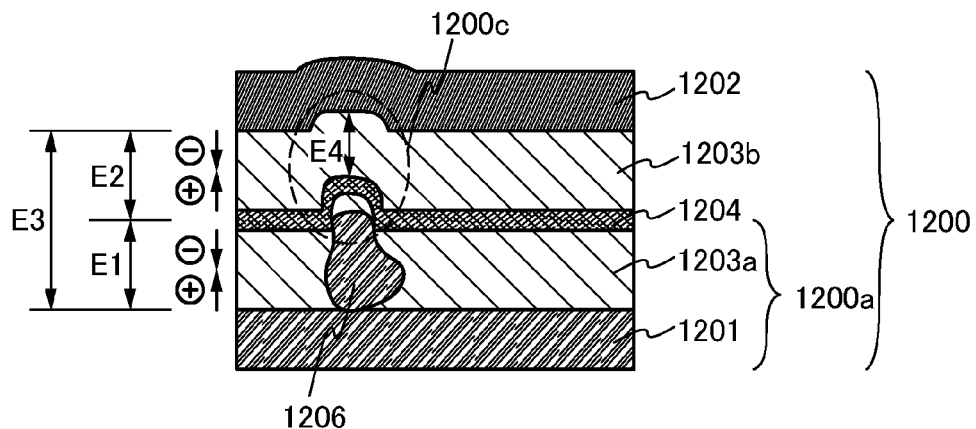
Figure 2C:
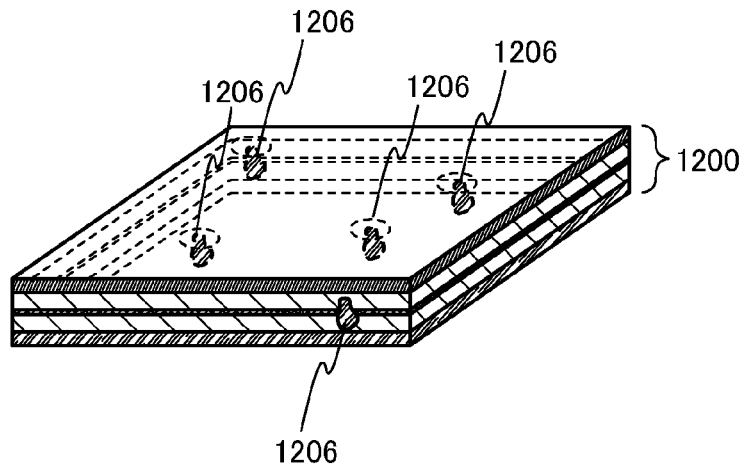

Next, a light-emitting element in which one of two EL layers which are partitioned by a charge generation layer includes a conductive foreign substance is described with reference to FIGS. 2B and 2C.

A light-emitting element 1200 includes a first EL layer 1203*a*, a second EL layer 1203*b*, a charge generation layer 1204, a first electrode 1201, a second electrode 1202, and a conductive foreign substance 1206. The light-emitting element 1200 is an abnormal element which is formed so as to be the same structure as that of the light-emitting element 1100 but which includes the conductive foreign substance 1206 unintentionally. Note that a state where the conductive foreign substance 1206 enters occurs less frequently, and potential defects resides in a dispersed manner in a normal portion as illustrated in FIG. 2C, for example.

When a current I (A) is supplied to a normal light-emitting element 1100, a voltage $E_1$ (V) at which a current I (A) is supplied to the first region 1100*a* is applied thereto, and a voltage $E_2$ (V) at which a current I (A) is supplied to the second region 1100*b* is applied thereto. Therefore, a voltage of about $E_1$ (V)+$E_2$ (V)=$E_3$ (V) is applied between the first electrode and the second electrode of the light-emitting element 1100. Note that, in the case where each of the EL layers of the light-emitting element 1200 emits visible light, $E_1$ (V) and $E_2$ (V) are each higher than 2 (V) inclusive, and $E_3$ (V) is higher than the sum.

On the other hand, in the case of the light-emitting element 1200 including the conductive foreign substance 1206, the charge generation layer 1204 and the first electrode 1201 are short-circuited by the conductive foreign substance 1206, and the charge generation layer 1204 in the vicinity of the conductive foreign substance 1206 has almost the same electric potential as the first electrode 1201.

For example, when a voltage of $E_3$ (V) is applied to the light-emitting element 1200, a voltage which is applied to a normal region of the second EL layer 1203*b* is $E_2$ (V). However, a voltage $E_4$ (V) which is applied to the region 1200*c* including the second EL layer 1203*b* between the charge generation layer 1204 in the vicinity of the conductive foreign substance 1206 and the second electrode 1202 is $E_3$ (V) which is higher than $E_2$ (V) almost by an amount of $E_1$ (V). Note that, in the case where the region 1200*a* has a structure for emitting visible light, $E_1$ (V) is more than about 2 (V) inclusive.

As described above, the second EL layer 1203*b* in the region 1200*c* emits extremely strong light because a voltage higher than the vicinity by about 2 (V) or more is applied thereto. Accordingly, in the light-emitting element provided with a plurality of EL layers which are partitioned by a charge generation layer between a pair of electrodes, a position of a potential defect which has not caused a short circuit can be specified in such a manner that a portion which emits light extremely stronger than that in the vicinity is detected.

In addition, a method for detecting an abnormal light-emission portion while sweeping a voltage applied to the light-emitting element 1200 from 0 (V) to a light-emission start voltage for the normal portion of the light-emitting element 1200 is especially effective.

When a voltage applied to the light-emitting element 1200 is lower than the light-emission start voltage, the emission luminance of the normal portion of the light-emitting element is lower than 1 (cd/m$^2$). However, a higher voltage by an amount of voltage corresponding to the voltage drop occurring in the short-circuited EL layer due to the conductive foreign substance 1206 is applied to the second EL layer 1203*b* in the region 1200*c*. As a result, in a normal region of a light-emitting state at a luminance lower than 1 (cd/m$^2$), portions which emits light strongly at a luminance that considerably exceeds 1 (cd/m$^2$), for example a luminance of about 10,000 (cd/m$^2$), reside in a dispersed manner.

In this manner, a portion having a potential defect may be specified by detecting a portion which emits light much brighter than that in the vicinity.

Specifically, there are four steps: a first step of finding out a light-emission start voltage $E_0$ (V) of a normal light-emitting element and applying a first voltage lower than the light-emission start voltage $E_0$ (V) to a light-emitting element to be inspected; a second step of detecting a portion which emits light abnormally at a luminance of 1 (cd/m$^2$) or higher in a surface of the light-emitting element, through which light is extracted; a third step of specifying the coordinate of the detected an abnormal light-emitting portion; and a fourth step of setting a second voltage higher than the first voltage but lower than the light-emission start voltage $E_0$ (V) in the case where a portion which emits light at a luminance of 1 (cd/m$^2$) or higher has not been detected. A portion having a potential defect may be specified by conducting sequentially and repeating the four steps from the first step to the fourth step.

As described above, in a light-emitting element provided with a plurality of EL layers which are partitioned by a charge generation layer between a pair of electrodes, a potential defect which has not caused a short circuit can be detected in such a manner that a voltage lower than a light-emission start voltage $E_0$ (V) of a normal light-emitting element is applied to the light-emitting element to be inspected, and a portion which emits light at a luminance of 1 (cd/m$^2$) or higher is detected.

Embodiment 2

In this embodiment, methods for detecting and insulating a potential defect of a light-emitting element will be described along with a manufacturing apparatus of the light-emitting element.

Figure 4:
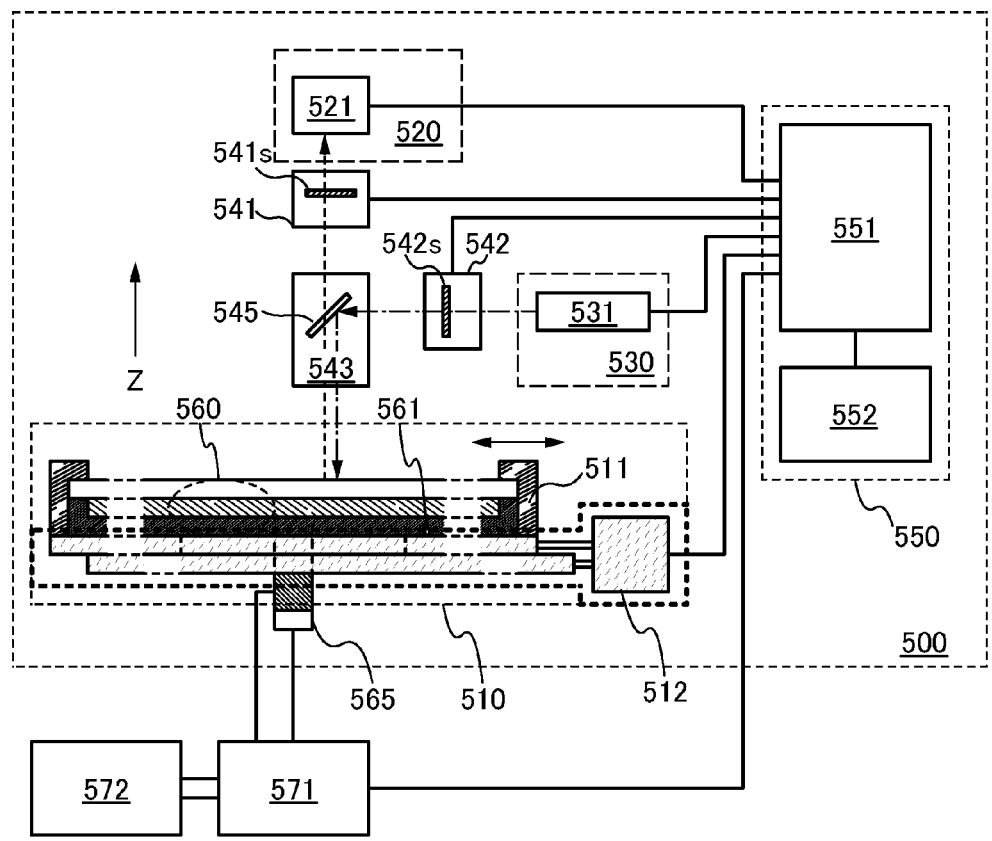
FIG. 4 illustrates a device for detecting and repairing an abnormal light-emission portion according to an embodiment.

FIG. 4 illustrates a side view of a manufacturing apparatus of a light-emitting element illustrated in this embodiment. A manufacturing apparatus 500 of a light-emitting element includes a sample stage 510 which holds and moves a light-emitting element 560 which is an inspection object, a detection system 520 which captures an image of the light-emitting element 560, an irradiation system 530 which repairs a potential defect 561, a first optical system 541 which sends an optical image of the light-emitting element 560 to the detection system 520, a second optical system 542 which sends emitted light from the irradiation system 530 to the potential defect 561, a third optical system 543 which transmit the emitted light and project a detailed optical image, and a control system 550. In this embodiment, a driving device 571 which drives the light-emitting element 560 which is an inspection object, and an external power source 572 are used.

The light-emitting element 560 is a light-emitting element provided with a plurality of EL layers which are partitioned by a charge generation layer between a pair of electrodes. Note that the light-emitting element 560 provided with a plurality of EL layers which are partitioned by a charge generation layer described in this embodiment includes a potential defect.

The light-emitting element 560 is fixed to a support mechanism 511 of the sample stage 510 with the surface thereof, through which light is extracted, facing toward the third optical system 543. The light-emitting element 560 is connected to the driving device 571, which drives a light-emitting element, and to the external power source 572 through a terminal portion 565 and the driving device 571. Note that the driving device 571 is connected to the control system 550.

An X-Y surface of the sample stage 510 is perpendicular to paper, and an arrow Z in FIG. 4 represents a Z-axis perpendicular to the X-Y surface. The sample stage 510 includes the support mechanism 511, which fixes and holds the light-emitting element 560 which is an inspection object, and a transfer mechanism 512, which is transferable by controlling the stage in a plane with the X-Y surface and in a Z-axis direction perpendicular to the X-Y surface. The transfer mechanism 512 is connected to the control system 550. As the transfer mechanism 512, a transfer mechanism which can transfer a sample stage at a resolution finer than 10 µm, preferably a resolution from 2 µm to 0.1 µm is used. Note that the transfer mechanism 512 may have a mechanism for rotating the sample stage in the X-Y surface or inclining a sample with respect to the X-Y surface.

The detection system 520 includes an imaging device 521. The imaging device 521 captures an image of the light-emitting element 560 through the first optical system 541 and the third optical system 543. The imaging device 521 is connected to the control system 550.

Of light emitted from the light-emitting element 560, the detection system 520 may detect at least light emission at a luminance of 1 (cd/m$^2$) or higher through the first optical system 541 and the third optical system 543. Accordingly, as the imaging device 521, a high-sensitive CCD camera is not necessarily used, and a comparably cheap CCD camera can be used.

The irradiation system 530 includes a laser device 531. The laser device 531 irradiates the light-emitting element 560 with laser light through the second optical system 542 and the third optical system 543. The laser device 531 is connected to the control system 550.

The irradiation system 530 preferably includes a guide light source for pointing out positions which are irradiated with the laser light emitted from the laser device 531. Although the laser irradiation positions which are pointed out by the guide light source can be confirmed at the imaging device 521, the light is weak enough not to damage the light-emitting element even if the light-emitting element is irradiated with the light.

In the laser device 531 used in this embodiment, laser light whose wavelength is not absorbed by a support or a sealing film of the light-emitting element or a sealing substrate is selected and used. For example, as the laser light, it is possible to use light emitted from one or more of a gas laser such as an Ar laser, a Kr laser, or an excimer laser; or a solid-state laser such as a laser using, as a medium, single crystalline YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$, to which one or more of Nd, Yb, Cr, Ti, Ho, Er, Tm, or Ta is added as a dopant, a glass laser, a ruby laser, an alexandrite laser, a Ti:sapphire laser, or a fiber laser. Additionally, a second harmonic or a third harmonic emitted from the above-described solid-state laser, and a higher harmonics can be used. Note that, when a solid-state laser whose laser medium is solid is used, there are advantages in that a maintenance-free condition can be maintained for a long time and output of the laser light is relatively stable. A short time pulsed laser such as nanosecond, picosecond, and femtosecond is appropriate for this process. With the short time pulsed laser, a high-density energy which causes a multiphoton absorption phenomenon can be applied to an abnormal light-emission portion of a light-emitting element.

The first optical system 541 is connected to the imaging device 521 in the detection system 520, and the second optical system 542 is connected to the laser device 531 in the irradiation system 530. The first optical system 541 includes a first shutter 541s, and the second optical system 542 includes a second shutter 542s. The first shutter 541s and the second shutter 542s are each connected to the control system 550.

The third optical system 543 is connected to the first optical system 541 and the second optical system 542, and includes optical elements such as a half mirror 545 and a condenser lens, for example. The third optical system 543 may include exchangeable condenser lenses each having a different magnification. Note that a method for aligning optical axes of the detection system 520 and the irradiation system 530 with the half mirror 545 is preferably applied because the device is easily downsized.

The control system 550 includes a control device 551 and a display device 552. The control device 551 is connected to at least the transfer mechanism 512, the imaging device 521, the laser device 531, the first shutter 541s, the second shutter 542s, the driving device 571, and the display device 552.

The control device 551 functions also as an image analysis device.

Next, one example of the operation of the manufacturing apparatus 500 of the light-emitting element which is illustrated in this embodiment is described.

Figure 5A:
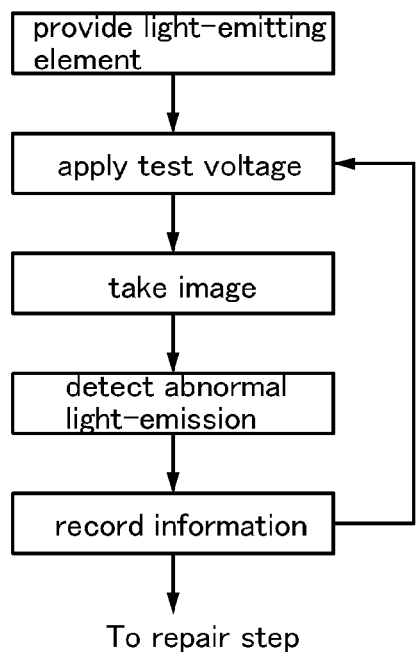
FIGS. 5A and 5B each illustrate a method for detecting an abnormal light-emission portion according to an embodiment.
Figure 5B:
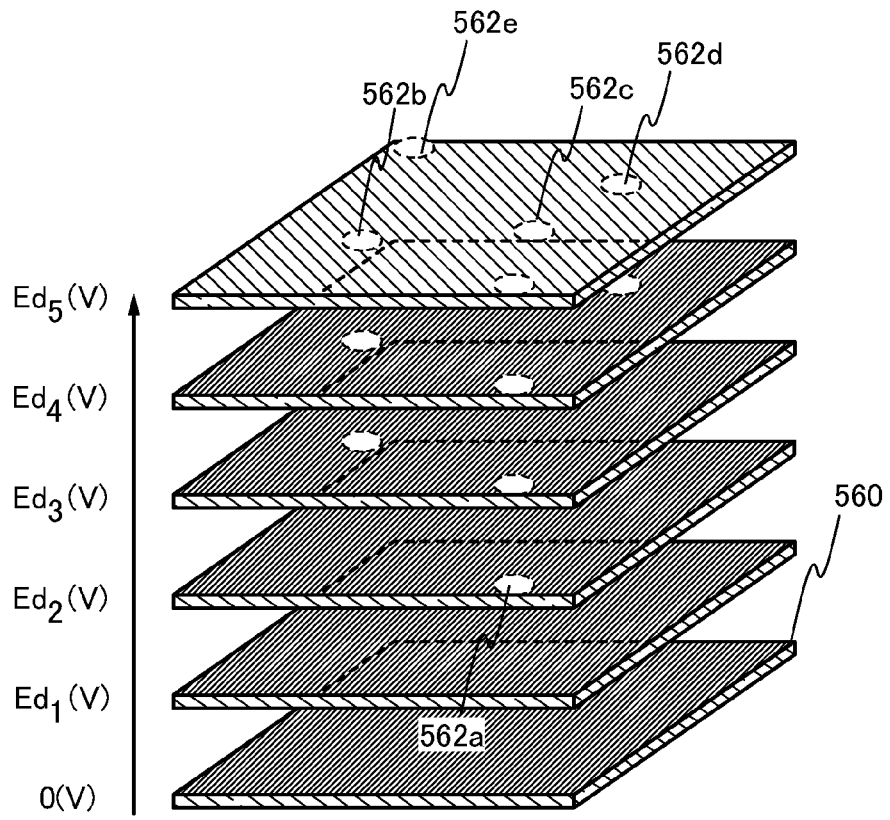

FIGS. 5A and 5B illustrate one example of a method for detecting a potential defect in this embodiment. The method for detecting a potential defect in this embodiment has five steps: a first step of fixing a light-emitting element which is an object to be inspected on the sample stage and adjusting the optical systems to be prepared for shooting; a second step of applying a test voltage to the light-emitting element; a third step of capturing an image data of the light-emitting element; a fourth step of specifying a portion on the light-emitting element by analyzing the image data and detecting a portion where light is emitted at a luminance higher than 1 (cd/m$^2$); and a fifth step of recording voltage applied to the light-emitting element and the positional information of a portion where light is emitted at a luminance higher than 1 (cd/m$^2$).

In the first step, the light-emitting element 560 which is an object to be inspected is fixed to the sample stage 510, the transfer mechanism 512, the first optical system 541, and the third optical system 543 are adjusted, and an image of the light-emitting element 560 is captured by the detection system 520. At this time, the first optical system 541 and the third optical system 543 are adjusted so that the detection system 520 captures the substantially entire surface of the light-emitting element 560, through which light is extracted. The inspection time can be shortened by inspecting a wider area of the light-emitting element 560.

In the second step, a first test voltage $Ed_1$ (V) is applied, in the forward direction, to the first electrode and the second electrode of the light-emitting element 560 from the driving device 571 with the control device 551.

The first test voltage $Ed_1$ (V) is lower than the light-emission start voltage $E_0$ (V) of a normal portion of the light-emitting element 560. For example, in the case where the light-emitting element 560 is provided with n EL layers which are partitioned by charge generation layers, the light-emission start voltage $E_0$ (V) which is divided into n or more may be the first test voltage $Ed_1$ (V).

In this embodiment, for example, the light-emission start voltage $E_0$ (V) is divided into five, and the first test voltage $Ed_1$ (V) is set to $E_0/5$ (V); the second test voltage $Ed_2$ (V) is set to $E_0 \times 2/5$ (V); the third test voltage $Ed_3$ (V) is set to $E_0 \times 3/5$ (V); the fourth test voltage $Ed_4$ (V) is set to $E_0 \times 4/5$ (V); and the fifth test voltage $Ed_5$ (V) is set to $E_0$ (V). A voltage up to the light-emission start voltage $E_0$ (V) is gradually applied to the light-emitting element 560 in this manner, whereby an accident of breakage of the light-emitting element 560 by supplying excessive current to a potential defect can be avoided.

In the case where the light-emission start voltages of each of the stacked EL layers is known, a voltage corresponding to the light-emission start voltages of each of the EL layers may be applied in the order form low to high. Subsequently, the total voltage which is obtained by combining light-emission start voltages of a plurality of the EL layers may be applied in the order from small to large. Thus, whether there is abnormal light emission or not can be inspected in a short time without breaking the light-emitting element 560 by supplying excessive current to a potential defect.

In the third step, in the state where the first test voltage $Ed_1$ (V) is applied to the light-emitting element 560, an image of the light-emitting element 560 is captured to the control device 551. Specifically, the second shutter 542s is closed and the first shutter 541s is opened. The imaging device 521 converts the image of the light-emitting element 560 into an image signal through the third optical system 543 and the first optical system 541, and outputs the signal to the control device 551.

In a normal region of a light-emitting state at a luminance lower than 1 (cd/m$^2$), an abnormal light-emission portion can be easily detected because light is emitted at a luminance of 1 (cd/m$^2$) or higher or a luminance that considerably exceeds 1 (cd/m$^2$). Accordingly, it is possible to observe a wider area and roughly specify the position of the abnormal light-emission portion, whereby the inspection can be effectively performed. For example, one pixel may be observed at a resolution of about 10 μm to 1 mm.

In the fourth step, the control device 551 analyzes the image signal and detects a portion which emits light abnormally emitted at a luminance of 1 (cd/m$^2$) or higher. The control device 551 calculates the positional information over the sample stage 510 by combining the positional information over the image with the coordinate information of the transfer mechanism 512.

In the fifth step, a first test voltage $Ed_1$ (V) which is applied and the positional information of the abnormal light-emission portion are recorded together. Note that the image, the luminance, and the chromaticity may be recorded.

After the above five steps are performed, a voltage applied to the light-emitting element 560 is changed to a second test voltage $Ed_2$ (V), and the process is performed again from the second step. While a driving voltage is increased like a staircase from $Ed_1$ (V) to $Ed_5$ (V) after that, the steps from the second step to the fifth step are repeated, and the positional information of the portion which emits light abnormally at a voltage lower than the light-emission start voltage is recorded. FIG. 5B schematically illustrates the test voltages and the positional information of the abnormal light-emission portions 562a to 562e which are recorded in such a manner.

Although the first optical system 541 and the third optical system 543 are adjusted so that the entire image of the light-emitting element 560 can be captured in the first step, a potential defect may be detected in such a manner that the surface of the light-emitting element 560, through which light is extracted, is divided into several regions. Since a large-sized light-emitting element can be inspected using a small device by dividing the surface of the light-emitting element 560 into several regions, the cost of the inspection device can be reduced. By dividing the surface into several regions, an image can be shot at an increased magnification; therefore, the resolution is increased and minute abnormal light emission can be captured.

Figure 6:
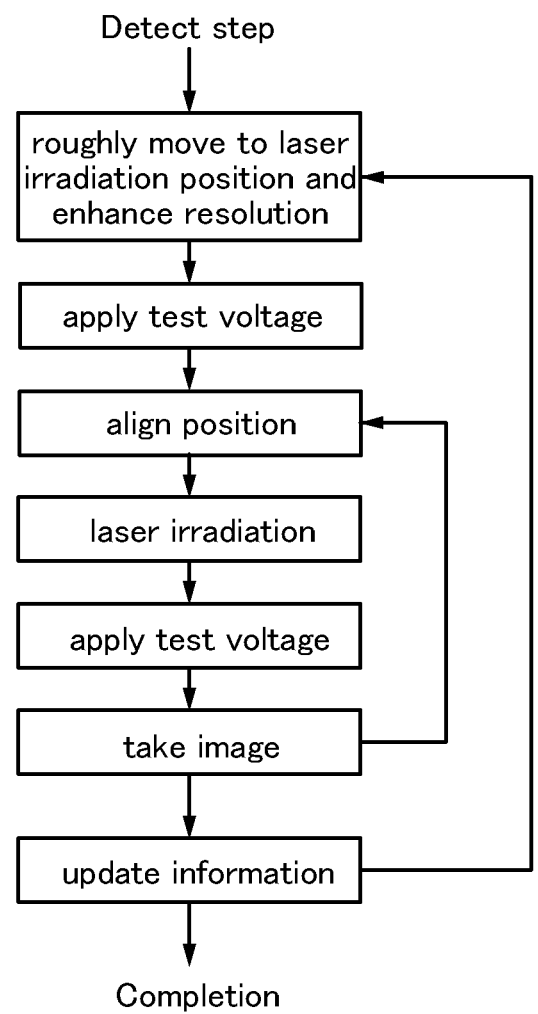
FIG. 6 illustrates a method for repairing an abnormal light-emission portion according to an embodiment.

FIG. 6 illustrates a process for insulating a potential defect in this embodiment. It is preferable to perform sequentially the process for insulating a potential defect after the process for detecting an abnormal light-emission portion. The positional information of the abnormal light-emission portion can be used with high accuracy by sequentially performing the process for insulating a potential defect.

The order of repairing the abnormal light-emission portions is determined in accordance with the positional information obtained in the process for detecting an abnormal light-emission portion and the test voltages corresponding to the positional information obtained therein. Although the abnormal light-emission portion which is detected under a condition of a lower test voltage is repaired first in this embodiment, abnormal light-emission portions which exist in a near distance with each other may be selected and repaired sequentially.

In the sixth step to the eighth step, the transfer mechanism 512 accurately moves the abnormal light-emission portion of the light-emitting element 560 to a laser irradiation position in accordance with the positional information of the abnormal light-emission portion obtained in the inspection process.

In the third step, in order to enhance the inspection efficiency, a larger area is observed, and then the position of the abnormal light-emission portion is just roughly specified. Therefore, in the sixth step, after the abnormal light-emission portion is roughly moved to the laser irradiation position, it is necessary to observe the abnormal light-emission portion at a higher resolution and then accurately align the portion with the laser irradiation position. Specifically, the magnification of the third optical system is changed and the position of the abnormal light-emission portion is specified with high accuracy. For example, it is set to be about 0.1 μm per pixel.

For example, in the case of insulating the abnormal light-emission portion 562a illustrated in FIG. 5B, the abnormal light-emission portion 562a is roughly moved to the laser irradiation position. Next, the magnification of the third optical system 543 is changed to obtain a higher resolution.

In the seventh step, a voltage lower than or equal to the test voltage $Ed_2$ (V) at which the abnormal light-emission portion 562a is observed is applied to the light-emitting element 560 to observe an abnormal light emission. The imaging device 521 captures an image of the light-emitting element 560 through the third optical system 543 and the first optical system 541, converts the image into an image signal, and outputs the signal to the control device 551.

In the eighth step, the first shutter 541s and the second shutter 542s are opened, and the position of laser irradiation performed from the laser device 531 is indicated using a guide light emitted from the guide light source included in the irradiation system 530. The control system 550 moves the sample stage 510 by using the transfer mechanism 512, and makes an abnormal light-emission portion correspond with a laser irradiation position. Through this step, the abnormal light-emission portion of the light-emitting element 560 can be accurately moved to the laser irradiation position.

In the ninth step, the first shutter 541s is closed so that stray light of the laser light is prevented from entering the imaging device 521. Next, an abnormal light-emission portion is irradiated with laser light emitted from the laser device 531 through the second optical system 542 and the third optical system 543. Note that application of a test voltage to the light-emitting element 560 may be stopped in this step.

Laser light condensed using the third optical system 543 has a high energy density. The minute area which is irradiated with laser light reaches high temperature, and the vicinity of the potential defect 561 is insulated.

In the tenth step, application of a test voltage is performed, and it is confirmed in the eleventh step that an abnormal light-emission portion 562a has disappeared. Specifically, the confirmation is performed as follows: the second shutter 542s is closed; the first shutter 541s is opened; a test voltage $Ed_2$ (V) is applied to the light-emitting element 560; and then shooting is performed to see disappearance of the abnormal light-emission portion 562a.

In the case where the abnormal light-emission portion 562a has not disappeared, the positional information of the abnormal light-emission portion is captured again, and the laser irradiation is performed again from the eighth step.

In the case where the abnormal light-emission portion 562a has disappeared, in the twelfth step, the control system 550 writes the information that the abnormal light-emission portion 562a has disappeared to the information of abnormal light-emission portions. Next, the step is returned to the sixth step to refer the information of the abnormal light-emission portion, and another abnormal light-emission portion begins to be repaired.

As described above, potential defects detected in the first step to the fifth step are insulated by performing repeatedly the sixth step to the twelfth step. The detection and repair of the first step to the twelfth step may be automatically operated using the control device 551, or the operator may judge the condition in the middle of the operation so that the detection and repair are semi-automatically advanced.

According to this embodiment, a voltage lower than the light-emission start voltage $E_0$ (V) of the normal light-emitting element is applied to the light-emitting element which is to be inspected, and a portion which emits light at a luminance of 1 ($cd/m^2$) or higher is detected, whereby a potential defect which has not caused a short circuit in the light-emitting element provided with a plurality of EL layers which are partitioned by a charge generation layer between a pair of the electrodes can be detected.

An abnormal light-emission portion which emits light strongly at a luminance of 1 ($cd/m^2$) or higher is detected in a normal region of a light-emitting state at a luminance lower than 1 ($cd/m^2$); therefore, a high-sensitive CCD camera or the like is not necessary, and the apparatus can be manufactured inexpensively.

In addition, the abnormal light-emission portion can be detected from a wide observation range because the abnormal light-emission portion has a strong luminance of 1 ($cd/m^2$) or higher. Such a wide observation range makes the inspection time shorter.

According to this embodiment, a defect of a film that reduces a film thickness locally in a periphery of an insulating foreign substance which is attached during film formation can be detected and insulated as long as luminance distribution has abnormality.

This embodiment can be freely combined with any of the other embodiments in this specification.

This embodiment may be combined with a conventional method. Specifically, the reverse bias is applied to a light-emitting element so that a current is supplied to the short-circuited portion. The light-emitting element may be observed by using an emission microscope, and the position of a short-circuited portion may be specified. Note that the emission microscope is a device which can measure the number of photons generated while current flows. Many photons are detected in an apparent defect. The apparent defect, where many photons are detected, is irradiated with laser light to be insulated. After that, a potential defect may be detected according to this embodiment.

The light-emitting element which is an object to be inspected may be one light-emitting element provided with a plurality of EL layers which are partitioned by a charge generation layer between a pair of electrodes, or a light-emitting device where a plurality of light-emitting elements are arranged in line or in matrix. Additionally, a light-emitting device where a light-emitting element and a driver circuit are mounted on one substrate may be the object to be inspected.

The light-emitting element may be directly observed with the first optical system 541 and may be irradiated with laser light directly from the second optical system 542 without the use of the third optical system 543. As a method for changing relative positions of the detection system 520, the irradiation system 530, and the position of the light-emitting element 560, there is a method for moving the sample stage 510 which supports the light-emitting element 560. Alternatively, a method for moving the first optical system 541 and the second optical system 542 may be used. For example, reflection mirrors whose angle can be variable may be provided for the first optical system 541 and the second optical system 542.

Embodiment 3

In this embodiment, an embodiment of a light-emitting element provided with a plurality of EL layers which are partitioned by a charge generation layer between a pair of electrodes will be described in detail. Next, a light-emitting element provided with three EL layers any one of which emits light of different color from the other EL layers, which are partitioned by charge generation layers, between a pair of electrodes will be described, and a method for detecting and repairing a potential defect of the light-emitting element will be described.

A light-emitting element provided with a plurality of EL layers which are partitioned by a charge generation layer between a pair of electrodes is described with reference to FIG. 1A. The light-emitting element includes the first electrode 1001, the second electrode 1002, the n EL layers 1003 (n is a natural number of 2 or more) between both of the electrodes, and the charge generation layer 1004 between an m-th EL layer and an (m+1)-th EL layer (m is a natural number: $1 \leq m \leq n-1$).

The charge generation layer 1004 can be formed using a composite material of an organic compound and a metal oxide, a metal oxide, or a composite material of an organic compound and an alkali metal, an alkaline earth metal, or a compound thereof. Alternatively, these materials can be combined as appropriate. The composite material of an organic compound and a metal oxide includes, for example, an organic compound and a metal oxide such as $V_2O_5$, $MoO_3$, or $WO_3$. As the organic compound, various compounds such as an aromatic amine compound, a carbazole derivative, aromatic hydrocarbon, and a macromolecular compound (such as an oligomer, a dendrimer, or a polymer) can be used. Note that an organic compound having a hole mobility of greater than or equal to $1 \times 10^{-6}$ cm$^2$/Vs is preferably used as a hole-transport organic compound. However, any other substance may also be used as long as a hole-transport property thereof is higher than an electron-transport property thereof.

Note that the light-emitting element can be driven not only with low current by providing a plurality of EL layers which are partitioned by a charge generation layer between a pair of electrodes but can also be driven with low voltage by providing the charge generation layer 1004 to suppress increase of the driving voltage because these materials used for the charge generation layer 1004 are excellent in carrier-injection property and carrier-transport property.

Note that the charge generation layer 1004 has a function of injecting holes into one EL layer 1003 which is formed in contact with the charge generation layer 1004 and a function of injecting electrons into the other EL layer 1003 which is formed in contact with the charge generation layer 1004, when voltage is applied to the first electrode 1001 and the second electrode 1002. For example, in a stacked-layer element structure in which the first electrode 1001 is an anode and the second electrode 1002 is a cathode, the charge generation layer 1004 injects holes into the EL layer 1003 in contact with a side on the cathode side of the charge generation layer 1004 and injects electrons into the EL layer 1003 in contact with a side on the anode side of the charge generation layer 1004.

Figure 1B:
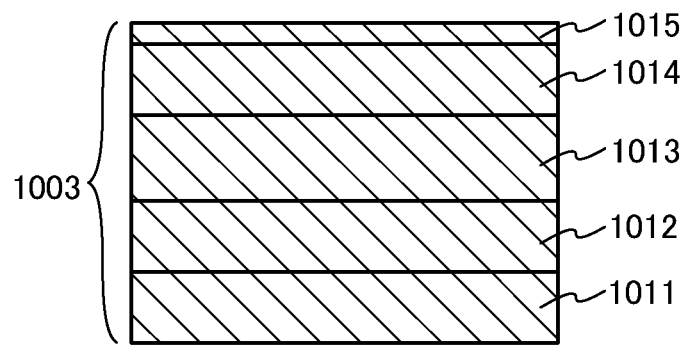

The structure of the EL layer 1003 is described with reference to FIG. 1B. The EL layer 1003 may include at least a light-emitting layer 1013, and the stacked structure including a functional layer other than the light-emitting layer 1013 may be employed. As the functional layers other than the light-emitting layer 1013, a layer containing a substance having a high hole-injection property, a layer containing a substance having a high hole-transport property, a layer containing a substance having a high electron-transport property, a layer containing a substance having a high electron-injection property, a layer containing a bipolar substance (a substance having high electron-transport and hole-transport properties), or the like can be used. Specifically, on the anode side from the light-emitting layer 1013, functional layers such as a hole-transport layer 1012 and a hole-injection layer 1011 can be used in combination as appropriate, and on the cathode side from the light-emitting layer 1013, functional layers such as an electron-transport layer 1014 and an electron-injection layer 1015 can be used in combination as appropriate.

Described below are specific examples of substances contained in layers in the case where the EL layer 1003 is formed including the hole-injection layer, the hole-transport layer, the light-emitting layer, the electron-transport layer, and the electron-injection layer.

The hole-injection layer contains a hole-injection substance. As the hole-injection substance, molybdenum oxide, vanadium oxide, ruthenium oxide, tungsten oxide, manganese oxide, or the like can be used. Alternatively, a phthalocyanine-based compound such as phthalocyanine (abbreviation: $H_2Pc$) or copper phthalocyanine (abbreviation: CuPc), a macromolecular substance such as PEDOT/PSS, or the like can be used as the hole-injection substance.

The hole-transport layer contains a hole-transport substance. As the hole-transport substance, the following can be given: aromatic amine compounds such as NPB (abbreviation), TPD (abbreviation), TCTA (abbreviation), TDATA (abbreviation), MTDATA (abbreviation) and 4,4'-bis[N-(spiro-9,9'-bifluorene-2-yl)-N-phenylamino]biphenyl (abbreviation: BSPB); and carbazole derivatives such as PCz-PCA1 (abbreviation), PCzPCA2 (abbreviation), PCzPCN1 (abbreviation), CBP (abbreviation), TCPB (abbreviation), and CzPA (abbreviation). Alternatively, it is also possible to use the following as the hole-transport substance: PVK (abbreviation), PVTPA (abbreviation), poly[N-(4-{N'-[4-(4-diphenylamino)phenyl]phenyl-N'-phenylamino}phenyl) methacryla mide](abbreviation: PTPDMA), or poly[N,N'-bis (4-butylphenyl)-N,N'-bis(phenyl)benzidine](abbreviation: Poly-TPD). Most of the substances described here have a hole mobility of greater than or equal to $1 \times 10^{-6}$ cm$^2$/Vs. Note that any other substance may also be used as long as a hole-transport property is higher than an electron-transport property. Furthermore, the hole-transport layer is not limited to a single layer, but can be two or more layers formed using the aforementioned substances stacked.

The light-emitting layer contains a light-emitting substance. The light-emitting substance can be a fluorescent compound or a phosphorescent compound which will be described below.

Examples of the fluorescent compound include the following: N,N'-bis[4-(9H-carbazol-9-yl)phenyl]-N,N'-diphenylstilbene-4,4'-diamine (abbreviation: YGA2S); 4-(9H-carbazol-9-yl)-4'-(10-phenyl-9-anthryl)triphenylamine (abbreviation: YGAPA); 4-(9H-carbazol-9-yl)-4'-(9,10-diphenyl-2-anthryl)triphenylamine (abbreviation: 2YGAPPA); N,9-diphenyl-N-[4-(10-phenyl-9-antryl)phenyl]-9H-carbazol-3-amine (abbreviation: PCAPA); perylene; 2,5,8,11-tetra-tert-butylperylene (abbreviation: TBP); 4-(10-phenyl-9-anthryl)-4'-(9-phenyl-9H-carbazol-3-yl)triphenylamine (abbreviation: PCBAPA); N,N''-(2-tert-butylanthracene-9,10-diyldi-4,1-phenylene)bis[N,N',N'-triphenyl-1,4-phen ylenediamine](abbreviation: DPABPA); N,9-diphenyl-N-[4-(9,10-diphenyl-2-anthryl)phenyl]-9H-carbazol-3-amine (abbreviation: 2PCAPPA); N-[4-(9,10-diphenyl-2-anthryl)phenyl]-N,N',N'-triphenyl-1,4-phenylenediamine (abbreviation: 2DPAPPA); N,N,N',N',N'',N'',N''',N'''-octaphenyldibenzo[g,p]chrysene-2,7,10,15-tetraamine (abbreviation: DBC1); coumarin 30; N-(9,10-diphenyl-2-anthryl)-N,9-diphenyl-9H-carbazol-3-amine (abbreviation: 2PCAPA); N-[9,10-bis(1,1'-biphenyl-2-yl)-2-anthryl]-N,9-diphenyl-9H-carbazol-3-amine (abbreviation: 2PCABPhA); N-(9,10-diphenyl-2-anthryl)-N,N'N'-triphenyl-1,4-phenylenediamine (abbreviation: 2DPAPA); N-[9,10-bis(1,1'-biphenyl-2-yl)-2-anthryl]-N,N'N'-triphenyl-1,4-phenylenediamine (abbreviation: 2DPABPhA); 9,10-bis(1,1'-biphenyl-2-yl)-N-[4-(9H-carbazol-9-yl)phenyl]-N-phenylanthracen-2-amine (abbreviation: 2YGABPhA); N,N,9-triphenylanthracen-9-amine (abbreviation: DPhAPhA); coumarin 545T; N,N'-diphenylquinacridone (abbreviation: DPQd); rubrene; 5,12-bis(1,1'-biphenyl-4-yl)-6,11-diphenyltetracene (abbreviation: BPT); 2-(2-{2-[4-(dimethylamino)phenyl]ethenyl}-6-methyl-4H-pyran-4-ylidene)propanedinitrile (abbreviation: DCM1); 2-{methyl-6-[2-(2,3,6,7-tetrahydro-1H,5H-benzo[ij]quinolizin-9-yl)ethenyl]-4H-pyran-4-ylidene}propanedinitrile (abbreviation: DCM2); N,N,N',N'-tetrakis(4-methylphenyl)tetracene-5,11-diamine (abbreviation: p-mPhTD); 7,14-diphenyl-N,N,N',N'-tetrakis(4-methylphenyl)acenaphtho[1,2-a]fluoranthene-3,10-diamine (abbreviation: p-mPhAFD); 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI); 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB); 2-(2,6-bis{2-[4-(dimethylamino)phenyl]ethenyl}-4H-pyran-4-ylidene)propanedinitrile (abbreviation: BisDCM); 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM); and the like.

Examples of the phosphorescent compound include the following: bis[2-(4',6'-difluorophenyl)pyridinato-N,$C^{2'}$]iridium(III tetrakis(1-pyrazolyl)borate (abbreviation: FIr6); bis[2-(4',6'-difluorophenyl)pyridinato-N,$C^{2'}$]iridium(III)picolinate (abbreviation: FIRpic); bis[2-(3',5'-bistrifluoromethylphenyl)pyridinato-N,$C^{2'}$]iridium(III) picolinate (abbreviation: Ir($CF_3$ ppy)$_2$ (pic)); bis[2-(4',6'-difluorophenyl)pyridinato-N,$C^{2'}$]iridium(III)acetylacetonate (abbreviation: FIr(acac)); tris(2-phenylpyridinato)iridium (III) (abbreviation: Ir(ppy)$_3$); bis(2-phenylpyridinato)iridium (III)acetylacetonato (abbreviation: Ir(ppy)$_2$ (acac)); bis (benzo[h]quinolinato)iridium(III)acetylacetonate (abbreviation: Ir(bzq)$_2$ (acac)); bis(2,4-diphenyl-1,3-oxazolato-N,$C^{2'}$)iridium(III)acetylacetonate (abbreviation: Ir(dpo)$_2$ (acac)); bis{2-[4'-(perfluorophenylphenyl)]pyridinato-N,$C^{2'}$}iridium(IIII)acetylacetonate (abbreviation: Ir(p-PF-ph)$_2$ (acac)); bis(2-phenylbenzothiazolato-N,$C^{2'}$)iridium (III)acetylacetonate (abbreviation: Ir(bt)$_2$ (acac)); bis[2-(2'-benzo[4,5-α]thienyl)pyridinato-N,$C^{3'}$]iridium(III) acetylacetonate (abbreviation: Ir(btp)$_2$ (acac)); bis(1-phenylisoquinolinato-N, $C^{2'}$)iridium(III)acetylacetonate (abbreviation: Ir(piq)$_2$ (acac)); (acetylacetonato)bis[2,3-bis (4-fluorophenyl)quinoxalinato]iridium(III) (abbreviation: Ir(Fdpq)$_2$ (acac)); (acetylacetonato)bis(2,3,5-triphenylpyrazinato)iridium(III) (abbreviation: Ir(tppr)$_2$ (acac)); 2,3,7,8,12,13,17,18-octaethyl-21H,23H-porphyrine)platinum(II) (abbreviation: PtOEP); tris(acetylacetonato) (monophenanthroline)terbium(III) (abbreviation: Tb(acac)$_3$ (Phen)); tris(1,3-diphenyl-1,3-propanedionato) (monophenanthroline)europium(III) (abbreviation: Eu(DBM)$_3$ (Phen)); tris[1-(2-thenoyl)-3,3,3-trifluoroacetonato](monophenanthroline)europium(III) (abbreviation: Eu(TTA)$_3$ (Phen)); and the like.

Note that the light-emitting layer preferably has a structure in which these light-emitting substances are dispersed in a host material. As the host material, the following can be used. For example, it is possible to use a hole-transport substance: an aromatic amine compound such as NPB (abbreviation), TPD (abbreviation), TCTA (abbreviation), TDATA (abbreviation), MTDATA (abbreviation), or BSPB (abbreviation); a carbazole derivative such as PCzPCA1 (abbreviation), PCzPCA2 (abbreviation), PCzPCN1 (abbreviation), CBP (abbreviation), TCPB (abbreviation), or CzPA (abbreviation); or a macromolecular compound such as PVK (abbreviation), PVTPA (abbreviation), PTPDMA (abbreviation), or Poly-TPD (abbreviation). It is also possible to use an electron-transport substance: a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolate)aluminum (abbreviation: BAlq); a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$); 2-(4-biphenylyl)-5-(4-tert-butylphenyl)-1,3,4-oxadiazole (abbreviation: PBD); 1,3-bis[5-(p-tert-butylphenyl)-1,3,4-oxadiazol-2-yl]benzene (abbreviation: OXD-7); 9-[4-(5-phenyl-1,3,4-oxadiazol-2-yl) phenyl]carbazole (abbreviation: CO11); 3-(4-biphenylyl)-4-phenyl-5-(4-tert-butylphenyl)-1,2,4-triazole (abbreviation: TAZ); bathophenanthroline (abbreviation: BPhen); bathocuproine (abbreviation: BCP); poly[(9,9-dihexylfluorene-2,7-diyl)-co-(pyridine-3,5-diyl)](abbreviation: PF-Py); or poly [(9,9-dioctyllfluorene-2,7-diyl)-co-(2,2'-bipyridine-6,6'-diyl)](abbreviation: PF-BPy).

The electron-transport layer contains an electron-transport substance. As the electron-transport substance, a metal complex having a quinoline skeleton or a benzoquinoline skeleton, such as Alq (abbreviation), Almq$_3$ (abbreviation), BeBq$_2$ (abbreviation), or BAlq (abbreviation), can be used. In addition to the above, a metal complex having an oxazole-based or thiazole-based ligand, such as Zn(BOX)$_2$ (abbreviation) or Zn(BTZ)$_2$ (abbreviation), can also be used. Furthermore, in addition to the above metal complexes, PBD (abbreviation), OXD-7 (abbreviation), CO11 (abbreviation), TAZ (abbreviation), BPhen (abbreviation), BCP (abbreviation), PF-Py (abbreviation), PF-BPy (abbreviation), or the like can also be used as the electron-transport substance. Most of the substances described here have an electron mobility of greater than or equal to $1 \times 10^{-6}$ cm$^2$/Vs. Note that any other substances may also be used as long as an electron-transport property is higher than a hole-transport property. Furthermore, the electron-transport layer is not limited to a single layer, but can be two or more layers formed using the aforementioned substances stacked.

The electron-injection layer contains an electron-injection substance. As the electron-injection substance, the following can be given: an alkali metal or an alkaline earth metal such as lithium fluoride (LiF), cesium fluoride (CsF), and calcium fluoride (CaF$_2$), and a compound thereof. Alternatively, an electron-transport substance containing an alkali metal, an alkaline earth metal, or a compound thereof (e.g., Alq (abbreviation) layer containing magnesium (Mg)) can be used as the electron-injection substance. Such a structure makes it possible to increase the efficiency of injection of electrons from the cathode.

In addition, a charge generation layer can be provided between a cathode and an EL layer or between an anode and an EL layer. In the case where the charge generation layer is provided between a cathode and an EL layer or between an anode and an EL layer, the charge generation layer contains a hole-transport substance and an acceptor substance. The charge generation layer may be not only a layer containing a hole-transport substance and an acceptor substance in the same film but also a stack of a layer containing a hole-transport substance and a layer containing an acceptor substance. However, in the case of the stacked structure, the layer containing an acceptor substance is in contact with the anode or the cathode.

The provision of the charge generation layer between a cathode and an EL layer or between an anode and an EL layer makes it possible to form the anode or the cathode without consideration of a work function of a substance for forming the electrodes. Note that a structure and substances similar to those of the above-described charge generation layer can be applied to the charge generation layer provided in the EL layer. Therefore, the description is omitted here by referring to the above description.

With the stack of these layers in an appropriate combination, the EL layer can be formed. Further, as a formation method of the EL layer, any of a variety of methods (e.g., a dry process and a wet process) can be selected as appropriate in accordance with a material to be used. For example, a vacuum evaporation method, an ink-jet method, a spin coating method, or the like can be used. Note that a different formation method may be employed for each layer.

There is no particular limitation on the first electrode 1001 formed over a support 1000; however, in the case of using the first electrode 1001 as an anode, it is preferable to use a metal, an alloy, an electrically conductive compound, a mixture of these materials, or the like, having a high work function (specifically, a work function of greater than or equal to 4.0 eV). Specifically, indium oxide-tin oxide (ITO: indium tin oxide), indium oxide-tin oxide containing silicon or silicon oxide, indium oxide-zinc oxide (IZO: indium zinc oxide), indium oxide containing tungsten oxide and zinc oxide (IWZO), and the like can be given. In addition, gold (Au), platinum (Pt), nickel (Ni), tungsten (W), chromium (Cr), molybdenum (Mo), iron (Fe), cobalt (Co), copper (Cu), palladium (Pd), titanium (Ti), a nitride thereof (e.g., titanium nitride), and the like can be given.

Films of these materials are generally formed with a sputtering method. For example, a film of indium oxide-zinc oxide (IZO) can be formed using a target in which zinc oxide is added to indium oxide at 1 wt % to 20 wt %. Indium oxide containing tungsten oxide and zinc oxide (IWZO) can be formed using a target in which tungsten oxide and zinc oxide are added to indium oxide at 0.5 wt % to 5 wt % and 0.1 wt % to 1 wt %, respectively. Alternatively, the films of these materials may be formed by an ink-jet method, a spin coating method, or the like by applying a sol-gel method or the like.

Note that, in the case where a layer including the composite material described above is used as the layer in contact with the first electrode 1001 of the EL layers 1003 formed over the first electrode 1001 which functions as an anode, any of a variety of metals, alloys, electrically conductive compounds, mixtures thereof, or the like can be used as a substance used for the first electrode 1001, regardless of their work functions. For example, aluminum (Al), silver (Ag), an alloy containing aluminum (AlSi), or the like can also be used.

Alternatively, the following low-work function materials can be given: Group 1 and Group 2 elements of the periodic table, that is, alkali metals such as lithium (Li) and cesium (Cs) and alkaline-earth metals such as magnesium (Mg), calcium (Ca), and strontium (Sr), and alloys thereof (MgAg, AlLi); rare earth metals such as europium (Eu) and ytterbium (Yb), and alloys thereof; and the like.

Note that, in the case where the first electrode 1001 is formed using an alkali metal, an alkaline-earth metal, or an alloy thereof, a vacuum evaporation method or a sputtering method can be used. Further alternatively, in the case where a silver paste or the like is used, a coating method, an ink-jet method, or the like can be used.

For the EL layers 1003 formed over the first electrode 1001, a known substance can be used, and any of low molecular compounds or macromolecular compounds can be used.

There is no particular limitation also on the second electrode 1002; however, a metal, an alloy, an electrically conductive compound, a mixture of these materials, or the like, having a low work function (specifically, a work function of less than or equal to 3.8 eV), can be used. As a specific example of such a cathode material, the following low-work function materials can be given: Group 1 and Group 2 elements of the periodic table, that is, alkali metals such as lithium (Li) and cesium (Cs) and alkaline-earth metals such as magnesium (Mg), calcium (Ca), and strontium (Sr), and alloys thereof (MgAg, AlLi); rare earth metals such as europium (Eu) and ytterbium (Yb), and alloys thereof; and the like.

Note that, in the case where the second electrode 1002 is formed using an alkali metal, an alkaline-earth metal, or an alloy thereof, a vacuum evaporation method or a sputtering method can be used. Further alternatively, in the case where a silver paste or the like is used, a coating method, an ink-jet method, or the like can be used.

Note that provision of the above electron-injection layer makes it possible to form the second electrode 1002 using any of a variety of conductive materials such as Al, Ag, ITO, and indium oxide-tin oxide containing silicon or silicon oxide, regardless of their work functions. A film of such a conductive material can be formed with a sputtering method, an ink-jet method, a spin coating method, or the like.

The support 1000 is used as a support of the light-emitting element. For the support 1000, glass, quartz, plastics, or the like can be used, for example. In the case of extracting light of the light-emitting element from the support 1000 side, a material having a light-transmitting property with respect to visible light is used for the support.

As specific examples of the glass substrate, any of the following substrates can be used: non-alkaline glass substrates formed using barium borosilicate glass, aluminoborosilicate glass, aluminosilicate glass, and the like by a fusion method or a float method; ceramic substrates; plastic substrates having heat resistance enough to withstand a process temperature of this manufacturing process; and the like. For example, a glass substrate which contains more barium oxide (BaO) than boric acid ($B_2O_3$) and has a strain point of 730° C. or higher is preferable. This is because the glass substrate does not strain even when an oxide semiconductor layer is thermally processed at high temperatures of approximately 700° C.

In the case where the support 1000 is a mother glass, the substrate may have any of the following sizes: the first generation (320 mm×400 mm), the second generation (400 mm×500 mm), the third generation (550 mm×650 mm), the fourth generation (680 mm×880 mm or 730 mm×920 mm), the fifth generation (1000 mm×1200 mm or 1100 mm×1250 mm), the sixth generation (1500 mm×1800 mm), the seventh generation (1900 mm×2200 mm), the eighth generation (2160 mm×2460 mm), the ninth generation (2400 mm×2800 mm or 2450 mm×3050 mm), the tenth generation (2950 mm×3400 mm), and the like.

Alternatively, a metal substrate such as a stainless steel alloy substrate, which is provided with an insulating film over the surface, may be used. A plastic substrate has features such as being lightweight, being flexible, and making visible light transmitted, which are attractive as a substrate of a light-emitting element. A substrate in which a layer with a moisture proof property is deposited onto or attached to a plastic substrate may be used so that the light-emitting element can be protected against an impurity such as water.

In addition, an insulating film may be formed over the support 1000 as a base film. The base film may be formed to have a single-layer structure or a stacked structure of a silicon oxide film, a silicon nitride film, a silicon oxynitride film, and/or a silicon nitride oxide film with a PCVD method, a sputtering method, or the like. Further, the support 1000 in which a driver circuit or the like of a light-emitting device is separately manufactured may be used, and an EL layer may be formed over a first electrode which is electrically connected to the driver circuit.

In the light-emitting element of this embodiment, a difference between an electric potential applied to the first electrode 1001 and an electric potential applied to the second electrode 1002 makes current flow, and holes and electrons are recombined with each other in the EL layer 1003, so that light is emitted. Therefore, in order to extract the light outside of the light-emitting element, one of or both the first electrode 1001 and the second electrode 1002 may be formed using a conductive film having a light-transmitting property.

Note that, when only the first electrode 1001 is an electrode having a light-transmitting property, light which is emitted from the EL layers 1003 is extracted from the support 1000 side through the first electrode 1001. Alternatively, when only the second electrode 1002 is an electrode having a light-transmitting property, light which is emitted from the EL layers 1003 is extracted from a side opposite to the support 1000 side through the second electrode 1002. Alternatively, when the first electrode 1001 and the second electrode 1002 are electrodes having a light-transmitting property, light which is emitted from the EL layers 1003 is extracted from both the support 1000 side and the side opposite to the support 1000 side through the first electrode 1001 and the second electrode 1002.

Figure 7A:
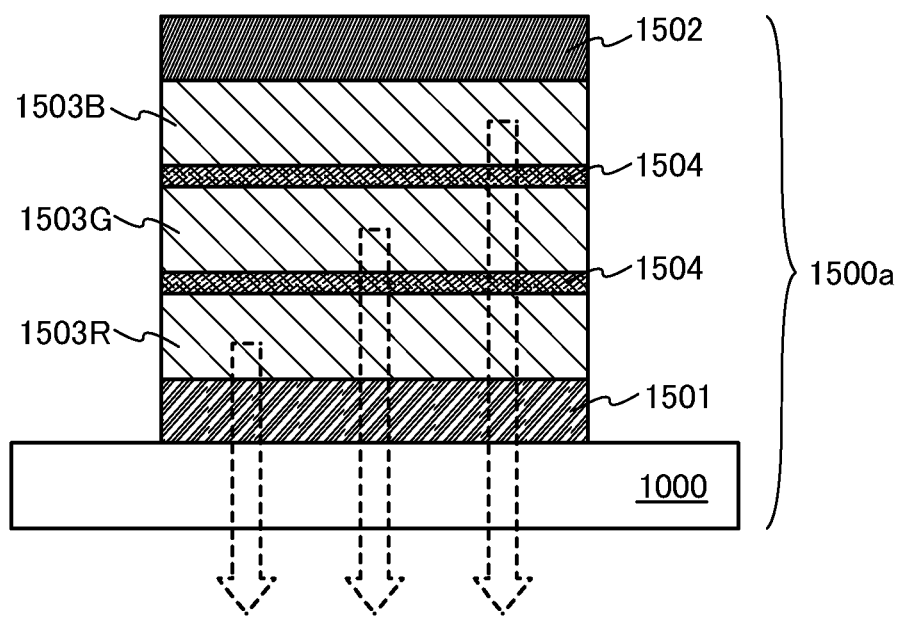
FIGS. 7A and 7B each illustrate a structure of a light-emitting element according to an embodiment.
Figure 7B:
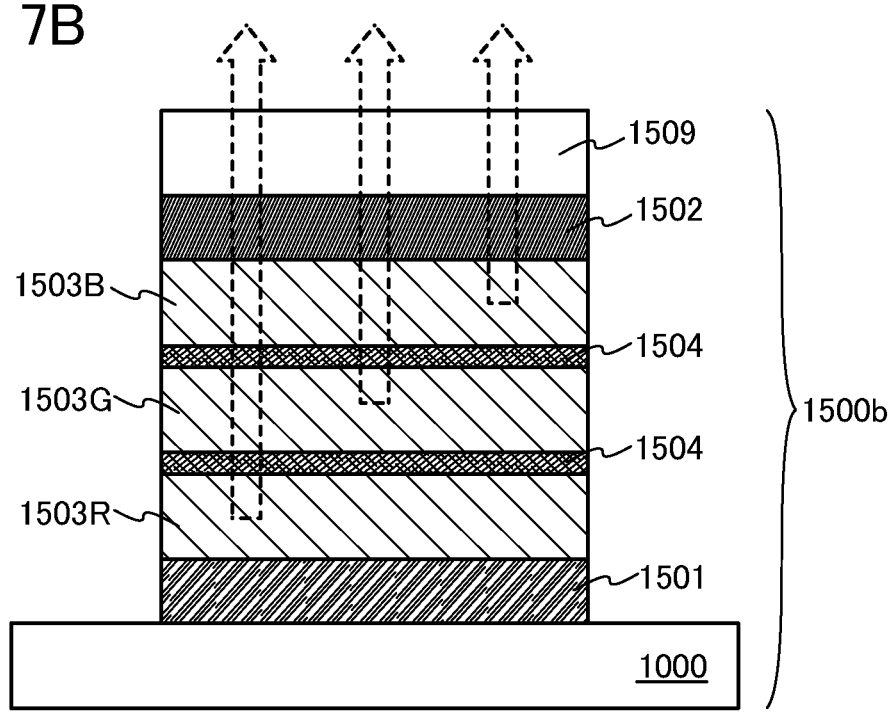

Next, a light-emitting element provided with three EL layers that emit light of a different color, which are partitioned by two charge generation layers, between a pair of electrodes is exemplified in FIGS. 7A and 7B.

A light-emitting element 1500a includes, over the support 1000 which transmits visible light, three EL layers 1503R, 1503G, and 1503B which are partitioned by two charge generation layers 1504, between a first electrode 1501 which transmits visible light and a second electrode 1502, and each layer can be formed using the aforementioned materials.

In addition, a light-emitting element 1500b includes, over a support 1000, the three EL layers 1503R, 1503G, and 1503B which are partitioned by the two charge generation layers 1504, between a first electrode 1501 and a second electrode 1502 which transmits visible light, and each layer can be formed using the aforementioned materials. Further, a sealing film 1509 which transmits visible light is formed over the second electrode 1502.

A method for detecting and insulating a potential defect by laser irradiation from the light extraction side of a light-emitting element is preferable because of facility in the structure of a light-emitting device. Accordingly, in the light-emitting element 1500a, a potential defect is detected and insulated from the support 1000 side, and in the light-emitting element 1500b, a potential defect is detected and insulated through the sealing film 1509 and the second electrode 1502.

The first EL layer 1503R includes a light-emitting layer which emits red light, the second EL layer 1503G includes a light-emitting layer which emits green light, and the third EL layer 1503B includes a light-emitting layer which emits blue light. Such a light-emitting element 1500a and a light-emitting element 1500b each emit white light as a whole. Note that the light emission color and the stack order of each EL layer are not limited to this example.

When EL layers each of which emits light of a different wavelength are stacked in such a manner, a light-emitting element which emits light of various wavelengths can be formed. For example, a light-emitting element which emits light of various wavelengths in a visible light region is excellent in a color rending property and is preferably used for illumination.

In the light-emitting element provided with a plurality of EL layers any one of which emits light of a different color from the other EL layers, which are partitioned by a charge generation layer, between a pair of electrodes, not only the luminance but also the chromaticity of a portion which a conductive foreign substance enters is changed.

In the light-emitting elements 1500a and 1500b, in the case where a conductive foreign substance enters the first EL layer 1503, light emission from the first EL layer 1503R is lost; therefore, strong light including a green light component and a blue light component is obtained. In addition, in the case where a conductive foreign substance enters the second EL layer 1503G, light emission from the second EL layer 1503G is lost; therefore, strong light including a red light component and the blue light component is obtained. Moreover, in the case where a conductive foreign substance enters the third EL layer 1503B, light emission from the third EL layer 1503B is lost; therefore, strong light including the red light component and the green light component is obtained.

Further, in the case where a conductive foreign substance enters over the first EL layer 1503R and the second EL layer 1503G, strong light including a blue light component is obtained. Furthermore, in the case where a conductive foreign substance enters over the second EL layer 1503G and the third EL layer 1503B, strong light including a red light component is obtained.

In the case of the light-emitting element provided with a plurality of EL layers any one of which emits light of a different color from the other EL layers, which are partitioned by a charge generation layer, between a pair of electrodes, not only the luminance but also the chromaticity of a potential defect which a conductive foreign substance enters is changed. Therefore, a potential defect which a conductive foreign substance enters can be detected when a voltage at which the substantially entire surface of the light-emitting element, from which light is extracted, is emitted at a luminance of 1 (cd/m$^2$) or higher is applied in the forward direction of the light-emitting element; the surface of the light-emitting element, from which light is extracted, is measured using an unit which observes chromaticity distribution; and an abnormal light-emission portion where chromaticity is different is detected.

As the observation unit for chromaticity distribution, a color CCD camera or the like can be used.

A potential defect of the light-emitting element provided with a plurality of EL layers any one of which emits light of a different color from the other EL layers, which are partitioned by a charge generation layer, between a pair of electrodes can be detected as an abnormal light-emission portion where luminance or chromaticity is different.

Note that the structure described in this embodiment can be combined with any of the structures described in the other embodiments as appropriate.

Embodiment 4

In this embodiment, a method for detecting and repairing a potential defect of a display device will be described. A light-emitting device which is an object to be inspected is described with reference to FIGS. 8A and 8B and FIGS. 9A and 9B.

Figure 8A:
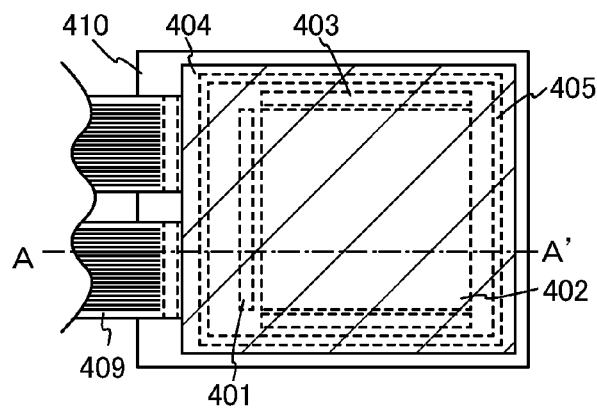
FIGS. 8A and 8B each illustrate a structure of a light-emitting device according to an embodiment.
Figure 8B:
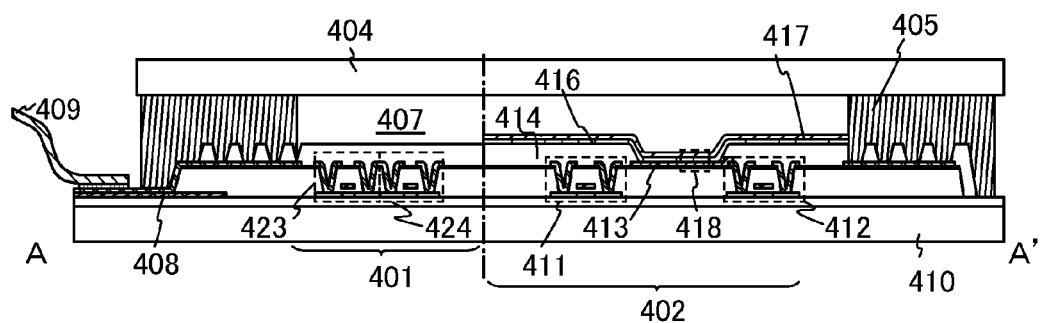

First, an active-matrix light-emitting device which controls driving of a light-emitting element with a transistor is described. FIG. 8A is a top view illustrating the light-emitting device, and FIG. 8B is a cross-sectional view taken along line A-A' of FIG. 8A. Reference numeral 401 denotes a driver circuit portion (source-side driver circuit); 402, a pixel portion; and 403, a driver circuit portion (gate-side driver circuit), which are indicated by dotted lines. Reference numeral 404 denotes a sealing substrate, reference numeral 405 denotes a sealant, and an inner side region enclosed by the sealant 405 is a space 407.

Note that a lead wiring 408 is a wiring for transmitting signals that are to be inputted to the source-side driver circuit 401 and the gate-side driver circuit 403, and receives a video signal, a clock signal, a start signal, a reset signal, and the like from a flexible printed circuit (FPC) 409 which serves as an external input terminal. Although only the FPC is illustrated, a printed wiring board (PWB) may be attached to the FPC. The light-emitting device in this specification includes not only a light-emitting device body but also a state in which an FPC or a PWB is attached thereto.

Next, a sectional structure of the light-emitting device will be described with reference to FIG. 8B. Although the driver circuit portions and the pixel portion having a plurality of pixels are formed over a substrate 410, the source-side driver circuit 401 which is the driver circuit portion and one of the plurality of pixels in the pixel portion 402 are illustrated here.

Note that, in the source-side driver circuit 401, a CMOS circuit which is obtained by combining an n-channel TFT 423 and a p-channel TFT 424 is formed. Further, the driver circuit may be formed using various circuits including TFTs, such as a CMOS circuit, a PMOS circuit, or an NMOS circuit. Although a driver integration type in which a driver circuit is formed over a substrate is described in this embodiment, a driver circuit is not necessarily formed over a substrate and can be formed outside a substrate.

The pixel portion 402 includes a plurality of pixels having a switching TFT 411, a current control TFT 412, and a first electrode 413 electrically connected to a drain of the current control TFT 412. An insulator 414 is formed to cover an end portion of the first electrode 413. Here, the insulator 414 is formed using a positive photosensitive acrylic resin film.

The insulator 414 is formed so as to have a curved surface having curvature at an upper end portion or a lower end portion thereof in order to obtain favorable coverage. For example, when positive type photosensitive acrylic is used as a material for the insulator 414, the insulator 414 preferably has a curved surface with a curvature radius (0.2 μm to 3 μm) only at the upper end portion. Alternatively, as the insulator 414, either a negative type which becomes insoluble in an etchant by light or a positive type which becomes soluble in an etchant by light can be used.

Over the first electrode 413, a layer 416 including a light-emitting substance and a second electrode 417 are formed. Here, as a material for forming the first electrode 413 which functions as an anode, it is preferable to use a material having a high work function. For example, the first electrode 413 can be formed using a stack of a titanium nitride film and a film containing aluminum as its main component; a three-layer structure of a titanium nitride film, a film containing aluminum as its main component, and another titanium nitride film; or the like, as well as a single-layer film such as an indium tin oxide (ITO) film, an indium tin oxide film containing silicon, an indium zinc oxide (IZO) film, a titanium nitride film, a chromium film, a tungsten film, a Zn film, or a Pt film. Note that, with a stacked structure, the first electrode 413 has low resistance as a wiring, forms a favorable ohmic contact, and can serve as an anode.

A plurality of EL layers which are partitioned by a charge generation layer are formed between the first electrode 413 and the second electrode 417 in a manner similar to that of Embodiment 3. In addition, a single layer or a stack of organic compound(s) is generally used as a material of the EL layer; however, a structure in which an inorganic compound is used in a film formed using an organic compound can be used.

The layer 416 including a light-emitting substance can be formed with various methods such as an evaporation method using an evaporation mask, an ink-jet method, or a spin coating method.

Furthermore, as a material used for the second electrode 417 which is to be formed over the layer 416 including a light-emitting substance, a material having a low work function (e.g., Al, Ag, Li, Ca, or an alloy or a compound of them, such as MgAg, MgIn, AlLi, CaF$_2$, or calcium nitride) is preferably used. Note that, in the case where light emitted from the layer 416 including a light-emitting substance is transmitted through the second electrode 417 which functions as a cathode, a stack of a metal thin film with reduced film thickness and a transparent conductive film (formed using an indium oxide-tin oxide alloy (ITO), an indium oxide-zinc oxide alloy (In$_2$O$_3$—ZnO), zinc oxide (ZnO), or the like) is preferably used as the second electrode 417.

Attachment of the sealing substrate 404 to the substrate 410 with the sealant 405 makes a structure in which a light-emitting element 418 is provided in the space 407 surrounded by the substrate 410, the sealing substrate 404, and the sealant 405. Note that the space 407 may be filled with an inert gas (e.g., nitrogen or argon) or with the sealant 405.

Note that, as the sealant 405, an epoxy-based resin is preferably used. In addition, it is preferable to use a material that allows permeation of moisture or oxygen as little as possible. As the sealing substrate 404, a plastic substrate made of fiberglass-reinforced plastics (FRP), polyvinyl fluoride (PVF), polyester, an acrylic resin, or the like can be used besides a glass substrate or a quartz substrate.

In the light-emitting element provided with a plurality of EL layers which are partitioned by a charge generation layer, which is manufactured as described above, a potential defect can be detected and repaired using the method and device exemplified in Embodiment 2.

According to an embodiment of the present invention, it is possible to detect a potential defect which has not caused a short circuit in a light-emitting element provided with a plurality of EL layers which are partitioned by a charge generation layer between a pair of electrodes. In addition, it is possible to provide a light-emitting device in which the potential defect has been insulated and repaired.

Figure 9A:
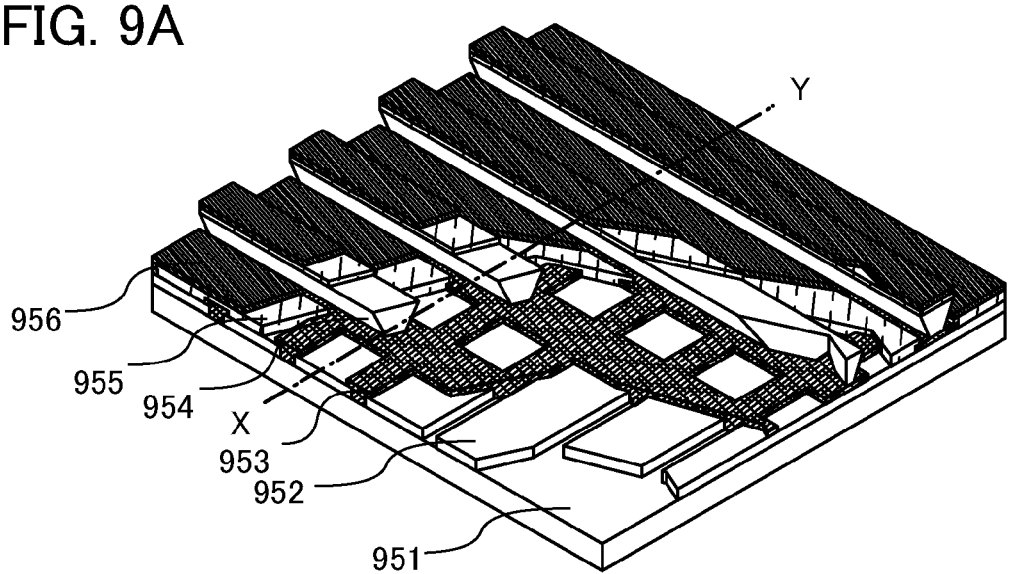
FIGS. 9A and 9B each illustrate a structure of a light-emitting device according to an embodiment.
Figure 9B:
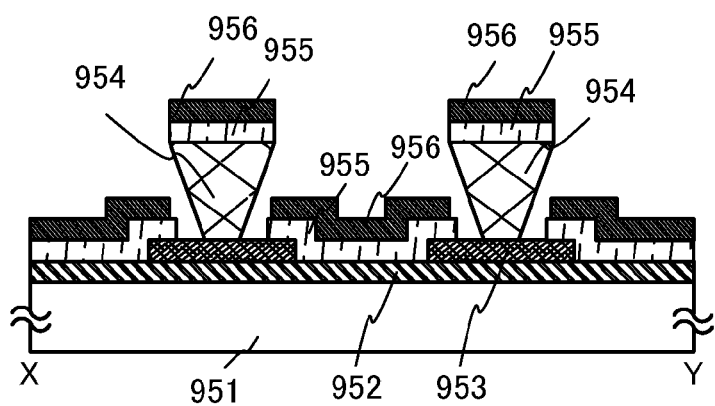

Next, a passive-matrix image display device is described. FIGS. 9A and 9B illustrate a passive-matrix image display device manufactured by applying an embodiment of the present invention. Note that FIG. 9A is a perspective view illustrating the passive-matrix image display device and FIG. 9B is a cross-sectional view of FIG. 9A taken along line X-Y. In FIGS. 9A and 9B, a first electrode 952 and a second electrode 956 are provided over a substrate 951, and a layer 955 including a light-emitting substance is provided between the first electrode 952 and the second electrode 956. The end portion of the first electrode 952 is covered with an insulating layer 953. A partition layer 954 is provided over the insulating layer 953.

The sidewalls of the partition layer 954 have slopes so that a distance between both sidewalls is gradually narrowed toward the surface of the substrate. In other words, a cross section taken in the direction of the short side of the partition layer 954 is trapezoidal, and the lower base of the cross section (a side facing in a direction similar to a plane direction of the insulating layer 953 and in contact with the insulating layer 953) is shorter than the upper side thereof (a side facing in a direction similar to the plane direction of the insulating layer 953 and not in contact with the insulating layer 953). By providing the partition layer 954 in this manner, defects of the light-emitting element due to static electricity and the like can be prevented.

A plurality of EL layers which are partitioned by a charge generation layer are formed between the first electrode 952 and the second electrode 956 in a manner similar to that of Embodiment 3.

In the case where a potential defect is generated in the light-emitting element provided with a plurality of EL layers which are partitioned by a charge generation layer, which is manufactured as described above, the potential defect can be detected and repaired using the method and device exemplified in Embodiment 2.

According to an embodiment of the present invention, it is possible to detect a potential defect which has not caused a short circuit in a light-emitting element provided with a plurality of EL layers which are partitioned by a charge generation layer between a pair of electrodes. In addition, it is possible to provide a light-emitting device in which the potential defect has been insulated and repaired.

Embodiment 5

In this embodiment, electronic devices partly including the light-emitting device in which a potential defect has been repaired, which is described in Embodiment 4, will be described. An electronic device including the light-emitting device described in Embodiment 4, in which a potential defect has been repaired, is highly reliable without appearance of failures which cause an abnormal light-emission portion, large variation in the characteristics, and a short circuit due to use for a long time.

As examples of the electronic devices each of which includes a light-emitting device manufactured using the light-emitting element according to an embodiment of the present invention, the following are given: cameras such as video cameras or digital cameras; goggle type displays; navigation systems; audio reproducing devices (e.g., car audio components and audio components); computers; game machines; portable information terminals (e.g., mobile computers, cellular phones, portable game machines, and electronic books); and image reproducing devices provided with recording media (specifically, a device capable of reproducing recording media such as digital versatile discs (DVDs) and provided with a display device that can display the image). Specific examples of these electronic devices are illustrated in FIGS. 10A to 10D.

Figure 10A:
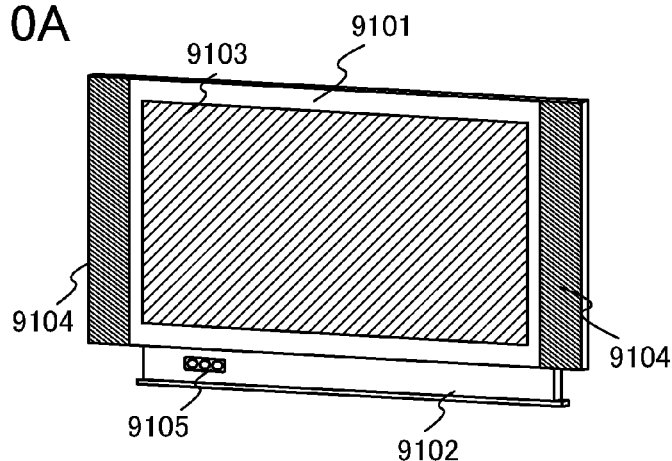
FIGS. 10A to 10D each illustrate an electronic device according to an embodiment.

FIG. 10A illustrates a television device according to an embodiment of the present invention, which includes a housing 9101, a support 9102, a display portion 9103, a speaker portion 9104, a video input terminal 9105, and the like. In the display portion 9103 of this television device, light-emitting elements similar to those described in Embodiment 4 are arranged in a matrix. The light-emitting element is characterized by a potential defect which has been repaired. The display portion 9103 including the light-emitting elements has similar characteristics; therefore, failures do not appear which cause an abnormal light-emission portion, large variation in characteristics, and a short circuit due to use for a long time. The television device according to an embodiment of the present invention as described above achieves high reliability; therefore, the television device can have durability for long time use, do not need to be replaced with new one uneconomically, and do not waste a resource.

Figure 10B:
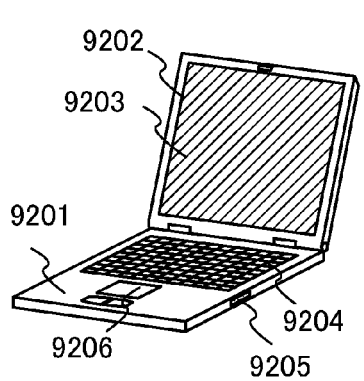

FIG. 10B illustrates a computer according to the present invention, which includes a main body 9201, a housing 9202, a display portion 9203, a keyboard 9204, an external connection port 9205, a pointing device 9206, and the like. In the display portion 9203 of this computer, light-emitting elements similar to those described in Embodiment 4 are arranged in a matrix. The light-emitting element is characterized by a potential defect which has been repaired. The display portion 9203 including the light-emitting elements has similar characteristics; therefore, failures do not appear which cause an abnormal light-emission portion, large variation in characteristics, and a short circuit due to use for a long time. The computer according to an embodiment of the present invention as described above achieves high reliability; therefore, a product that is suitable for portability can be provided.

Figure 10C:
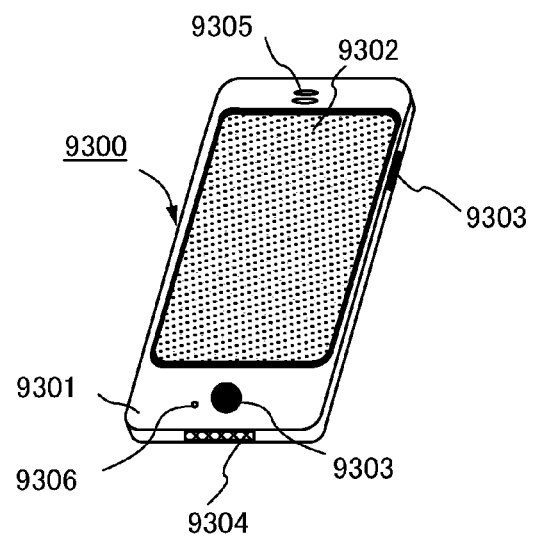

FIG. 10C illustrates a cellular phone 9300 according to an embodiment of the present invention, which includes a housing 9301, a display portion 9302, a switch 9303, a connection portion 9304, a speaker 9305, a microphone 9306, and the like. Information can be inputted when the display portion 9302 is touched with a finger or the like. In addition, operations such as making calls and composing mails can be also conducted by touching the display portion 9302 with a finger or the like. In the display portion 9302 of this cellular phone, the light-emitting elements similar to those described in Embodiment 4 are arranged in a matrix. The light-emitting element is characterized by a potential defect which has been repaired. The display portion 9302 including the light-emitting elements has similar characteristics; therefore, failures do not appear which cause an abnormal light-emission portion, large variation in characteristics, and a short circuit due to use for a long time. The cellular phone according to an embodiment of the present invention as described above achieves high reliability; therefore, a product that is suitable for portability can be provided.

Figure 10D:
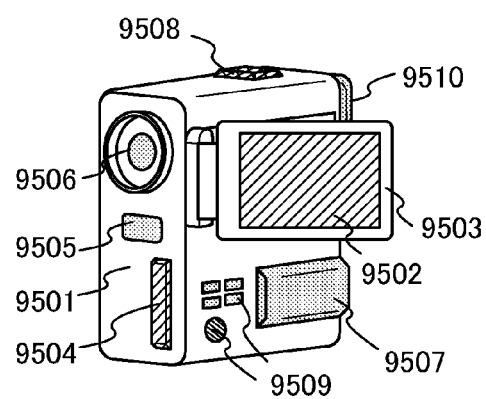

FIG. 10D illustrates a camera according to an embodiment of the present invention, which includes a main body 9501, a display portion 9502, a housing 9503, an external connection port 9504, a remote control receiving portion 9505, an image receiving portion 9506, a battery 9507, an audio input portion 9508, an operation key 9509, an eyepiece portion 9510, and the like. In the display portion 9502 of this camera, light-emitting elements similar to those described in Embodiment 4 are arranged in a matrix. The light-emitting element is characterized by a potential defect which has been repaired. The display portion 9502 including the light-emitting elements has similar characteristics; therefore, failures do not appear which cause an abnormal light-emission portion, large variation in characteristics, and a short circuit due to use for a long time. The camera according to an embodiment of the present invention as described above achieves high reliability; therefore, a product that is suitable for portability can be provided.

As thus described, application range of the light-emitting device which is manufactured with a method for detecting and repairing a potential defect according to an embodiment of the present invention is quite wide, and this light-emitting device can be applied to electronic devices of every field. The light-emitting element according to an embodiment of the present invention is used, whereby a highly reliable electronic device can be provided. In addition, a potential defect is detected and repaired, whereby an effect of increasing the yield of a non-defective product and reducing a production cost can be obtained.

Moreover, the light-emitting device which is manufactured with a method for detecting and repairing a potential defect according to an embodiment of the present invention can be used as an illumination device. An example of using the light-emitting element according to an embodiment of the present invention as an illumination device will be described with reference to FIG. 11.

Figure 11:
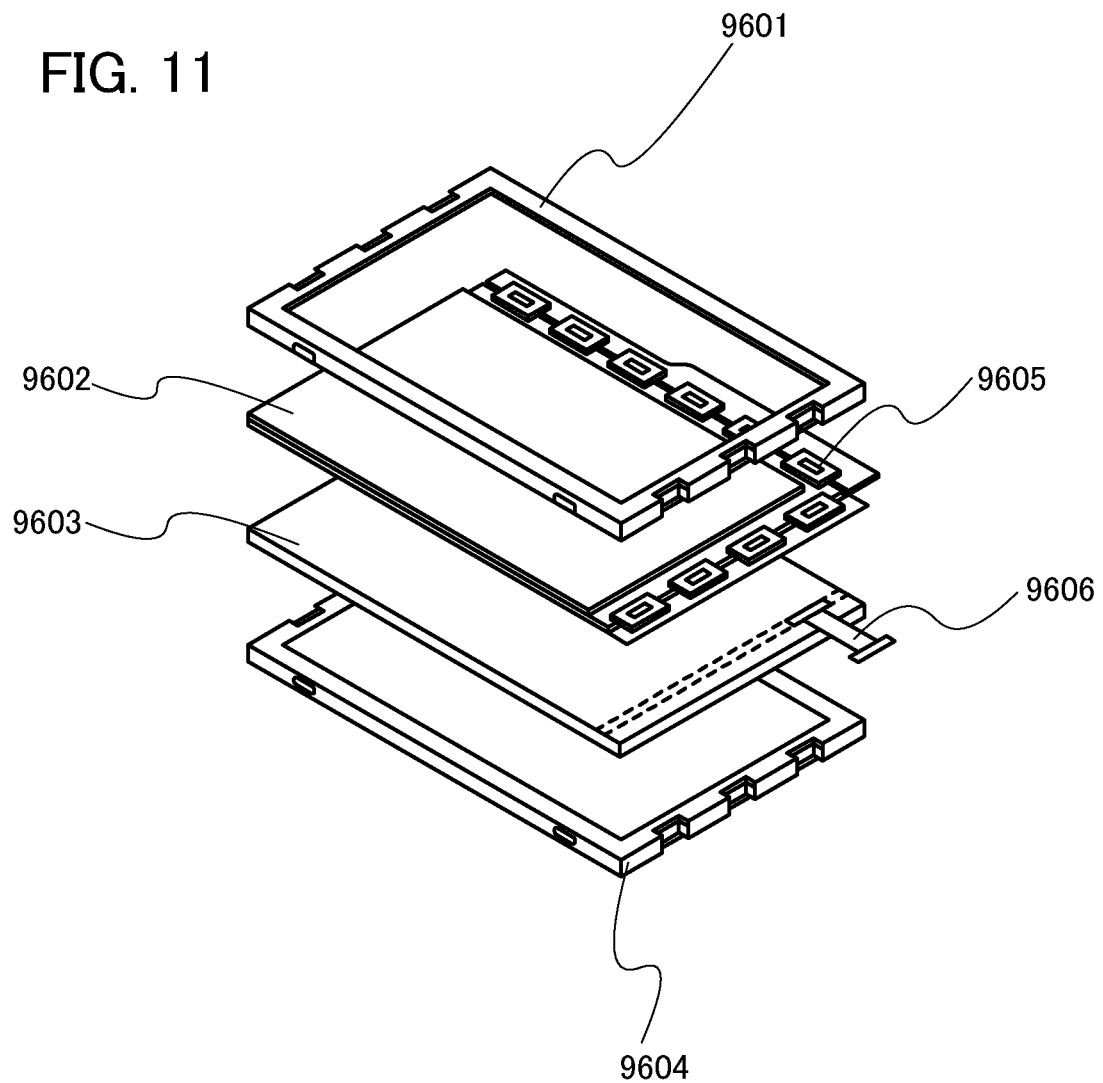
FIG. 11 illustrates an illumination device according to an embodiment.

FIG. 11 illustrates an example of a liquid crystal display device in which the light-emitting device according to an embodiment of the present invention is used as a backlight. The liquid crystal display device illustrated in FIG. 11 includes a housing 9601, a liquid crystal layer 9602, a backlight 9603, and a housing 9604, and the liquid crystal layer 9602 is connected to a driver IC 9605. The light-emitting device according to an embodiment of the present invention is used as the backlight 9603, and current is supplied through a terminal 9606.

With the use of the light-emitting device for the backlight of the liquid crystal display device, which is manufactured with a method for detecting and repairing a potential defect according to an embodiment of the present invention, a highly reliable backlight can be obtained. Moreover, since the light-emitting device is an illumination device of surface light emission and the enlargement of the light-emitting device is possible, the backlight can be made larger and the liquid crystal display device can also have a larger area. Additionally, in the light-emitting device, failures do not appear which cause an abnormal light-emission portion, large variation in characteristics, and a short circuit due to use for a long time, and thus high reliability is achieved. Therefore, reliability of the liquid crystal display device using the light-emitting device is also high.

Figure 12:
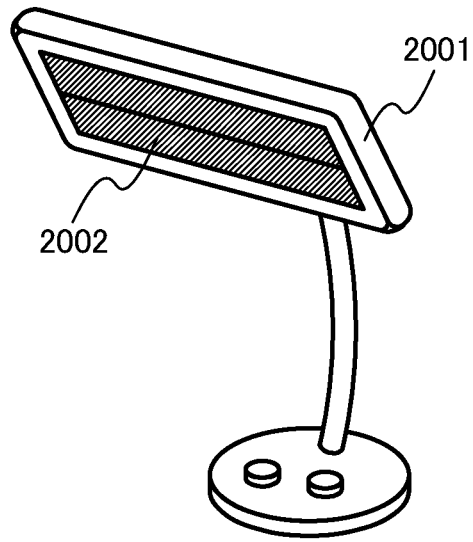
FIG. 12 illustrates an illumination device according to an embodiment.

FIG. 12 illustrates an example in which the light-emitting device to which an embodiment of the present invention is applied is used as a desk lamp, which is an illumination device. The desk lamp illustrated in FIG. 12 includes a housing 2001 and a light source 2002. The light-emitting device according to an embodiment of the present invention is used as the light source 2002. In the light-emitting device which is manufactured with a method for detecting and repairing a potential defect according to an embodiment of the present invention, failures do not appear which cause an abnormal light-emission portion, large variation in characteristics, and a short circuit due to use for a long time, and thus high reliability is achieved. Therefore, reliability of the desk lamp using the light-emitting device is also high.

Figure 13:
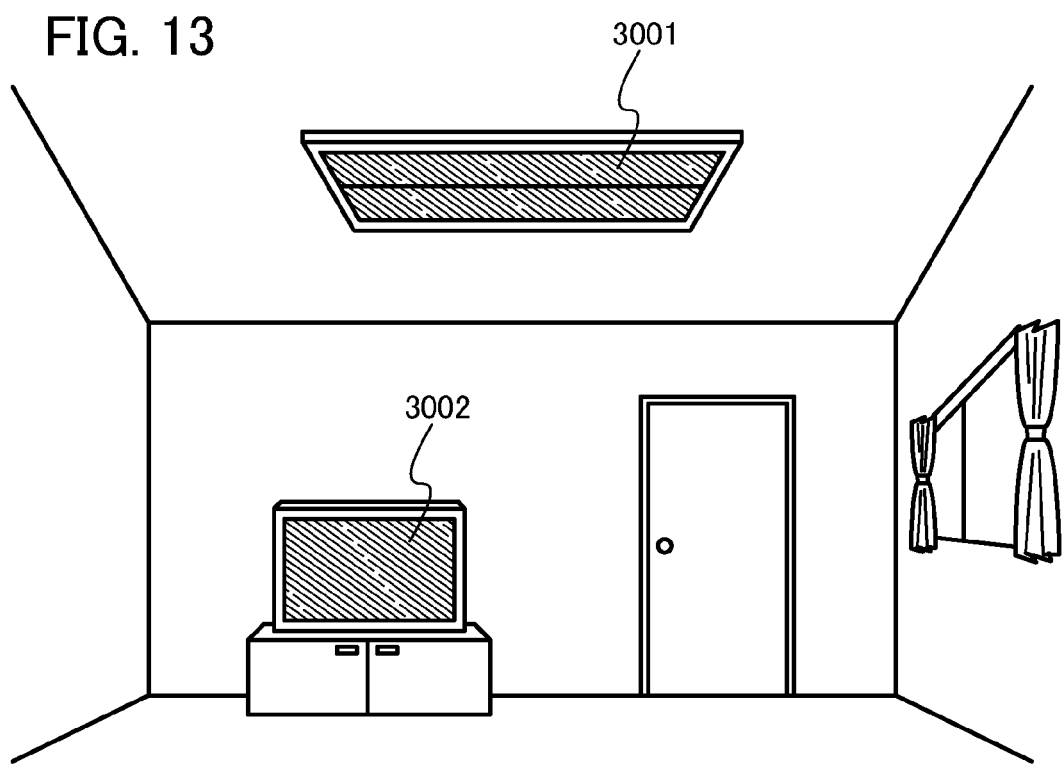
FIG. 13 illustrates an illumination device and a light-emitting device according to an embodiment.

FIG. 13 illustrates an example of using the light-emitting device to which an embodiment of the present invention is applied as an interior illumination device 3001.

The method for detecting and repairing a potential defect according to an embodiment of the present invention can also be applied to a light-emitting device, and the light-emitting device to which an embodiment of the present invention is applied can be used as a large-area illumination device. Further, since the light-emitting device according to an embodiment of the present invention is thin and consumes low power, it can be used as an illumination device having a thin shape and consuming low power.

In such a manner, a television device 3002 according to an embodiment of the present invention as illustrated in FIG. 10A is placed in a room where the light-emitting device to which an embodiment of the present invention is applied is used as the interior illumination device 3001 so that public broadcasting and movies can be watched. In such a case, since both of the devices have high reliability, the devices have durability for long time use, do not need to be replaced with new one due to breakdown, and do not waste a resource.

The present application is based on Japanese Patent Application serial No. 2009-175377 filed with Japan Patent Office on Jul. 28, 2009, the entire contents of which are hereby incorporated by reference.

EXPLANATION OF REFERENCE

401: source-side driver circuit, 402: pixel portion, 403: gate-side driver circuit, 404: sealing substrate, 405: sealant, 407: space, 408: lead wiring, 409: flexible printed circuit (FPC), 410: substrate, 411: switching TFT, 412: current control TFT, 413: first electrode, 414: insulator, 416: layer including a light-emitting substance, 417: second electrode, 418: light-emitting element, 423: n-channel TFT, 424: p-channel TFT, 500: manufacturing apparatus, 510: stage, 511: support mechanism, 512: transfer mechanism, 520: detection system, 521: imaging device, 530: irradiation system, 531: laser device, 541: first optical system, 541s: first shutter, 542: second optical system, 542s: second shutter, 543: third optical system, 545: half mirror, 550: control system, 551: control device, 552: display device, 560: light-emitting element, 561: potential defect, 562a: abnormal light-emission portion, 562b: abnormal light-emission portion, 562c: abnormal light-emission portion, 562d: abnormal light-emission portion, 562e: abnormal light-emission portion, 565: terminal portion, 571: driving device, 572: external power source, 951: substrate, 952: first electrode, 953: insulating layer, 954: partition layer, 955: layer including a light-emitting substance, 956: second electrode, 1000: support, 1001: first electrode, 1002: second electrode, 1003: EL layer, 1004: charge generation layer, 1011: hole-injection layer, 1012: hole-transport layer, 1013: light-emitting layer, 1014: electron-transport layer, 1015: electron-injection layer, 1100: light-emitting element, 1100a: first region, 1100b: second region, 1101: first electrode, 1102: second electrode, 1103a: first EL layer, 1103b: second EL layer, 1104: charge generation layer, 1200: light-emitting element, 1200a: region, 1200c: region, 1201: first electrode, 1202: second electrode, 1203a: first EL layer, 1203b: second EL layer, 1204: charge generation layer, 1206: conductive foreign substance, 1300: light-emitting element, 1301: first electrode, 1302: second electrode, 1303a: EL layer containing a light-emitting organic compound, 1400: light-emitting element, 1400a: first region, 1400b: second region, 1401: first electrode, 1402: second electrode, 1403a: EL layer, 1403b: EL layer, 1404: charge generation layer, 1500a: light-emitting element, 1500b: light-emitting element, 1501: first electrode, 1502: second electrode, 1503B: EL layer, 1503G: EL layer, 1503R: EL layer, 1504: charge generation layer, 1509: sealing film, 2001: housing, 2002: light source, 3001: illumination device, 3002: television device, 9101: housing, 9102: support, 9103: display portion, 9104: speaker portion, 9105: video input terminal, 9201: main body, 9202: housing, 9203: display portion, 9204: keyboard, 9205: external connection port, 9206: pointing device, 9301: housing, 9302: display portion, 9303: switch, 9304: connection portion, 9305: speaker, 9306: microphone, 9501: main body, 9502: display portion, 9503: housing, 9504: external connection port, 9505: remote control receiving portion, 9506: image receiving portion, 9507: battery, 9508: audio input portion, 9509: operation key, 9510: eyepiece portion, 9601: housing, 9602: liquid crystal layer, 9603: backlight, 9604: housing, 9605: driver IC, 9606: terminal.

The invention claimed is:

1. A method for inspecting a light-emitting element comprising the steps of:
　applying a first voltage lower than a light-emission start voltage to the light-emitting element in a forward direction, wherein the light-emitting element comprises a plurality of EL layers which are partitioned by a charge generation layer between a pair of electrodes, and emits light at a luminance of 1 ($cd/m^2$) or higher from a substantially entire surface of the light-emitting element at the light-emission start voltage;
　applying a second voltage which is higher than the first voltage and is lower than the light-emission start voltage to the light-emitting element in the forward direction, after applying the first voltage; and
　detecting an abnormal light-emission portion by observing an image of the light-emitting element.

2. The method for inspecting the light-emitting element according to claim 1,
　wherein the abnormal light-emission portion emits light at a luminance of 1 ($cd/m^2$) or higher in a surface of the light-emitting element, through which light is extracted, at the voltage lower than the light-emission start voltage.

3. The method for inspecting the light-emitting element according to claim 1,
　wherein a chromaticity in the abnormal light-emission portion is different from a chromaticity in the substantially entire surface of the light-emitting element.

4. A method for manufacturing a light-emitting element comprising the steps of:
　applying a first voltage lower than a light-emission start voltage to the light-emitting element in a forward direction, wherein the light-emitting element comprises a plurality of EL layers which are partitioned by a charge generation layer between a pair of electrodes, and emits light at a luminance of 1 ($cd/m^2$) or higher from a substantially entire surface of the light-emitting element at the light-emission start voltage;
　detecting an abnormal light-emission portion by observing an image of the light-emitting element;
　applying a second voltage which is higher than the first voltage and is lower than the light-emission start voltage to the light-emitting element in the forward direction, after applying the first voltage; and
　irradiating the abnormal light-emission portion with laser light so that the abnormal light-emission portion is insulated.

5. The method for manufacturing the light-emitting element according to claim 4,
　wherein the abnormal light-emission portion emits light at a luminance of 1 ($cd/m^2$) or higher in a surface of the light-emitting element, through which light is extracted, at the voltage lower than the light-emission start voltage.

6. The method for manufacturing the light-emitting element according to claim 4,
　wherein a chromaticity in the abnormal light-emission portion is different from a chromaticity in the substantially entire surface of the light-emitting element.

7. The method for manufacturing the light-emitting element according to claim 4,
　wherein a resolution of an observed image in the step of laser irradiation is higher than a resolution of an observed image in the step of detecting the abnormal light-emission portion.

8. The method for manufacturing the light-emitting element according to claim 4,
　wherein a resolution of an observed image in the step of laser irradiation is 100 to 10,000 times higher than a resolution of an observed image in the step of detecting the abnormal light-emission portion.

9. The method for manufacturing the light-emitting element according to claim 4,
　wherein a conductive foreign substance enters one of the plurality of EL layers.

10. A method for manufacturing a light-emitting device comprising the steps of:
　applying a first voltage lower than a light-emission start voltage to a light-emitting element in a forward direction, wherein the light-emitting element comprises a plurality of EL layers which are partitioned by a charge generation layer between a pair of electrodes, and emits light at a luminance of 1 ($cd/m^2$) or higher from a substantially entire surface of the light-emitting element at the light-emission start voltage;
　detecting an abnormal light-emission portion by observing an image of the light-emitting element;
　applying a second voltage which is higher than the first voltage and is lower than the light-emission start voltage to the light-emitting element in the forward direction, after applying the first voltage;
　irradiating the abnormal light-emission portion with laser light so that the abnormal light-emission portion is insulated; and
　providing a driver circuit on a substrate on which the light-emitting element is provided.

11. The method for manufacturing the light-emitting device according to claim 10,
　wherein the abnormal light-emission portion emits light at a luminance of 1 ($cd/m^2$) or higher in a surface of the light-emitting element, through which light is extracted, at the voltage lower than the light-emission start voltage.

12. The method for manufacturing the light-emitting device according to claim 10,
　wherein a chromaticity in the abnormal light-emission portion is different from a chromaticity in the substantially entire surface of the light-emitting element.

13. The method for manufacturing the light-emitting device according to claim 10,
　wherein a resolution of an observed image in the step of laser irradiation is higher than a resolution of an observed image in the step of detecting the abnormal light-emission portion.

14. The method for manufacturing the light-emitting device according to claim 10,
　wherein a resolution of an observed image in the step of laser irradiation is 100 to 10,000 times higher than a resolution of an observed image in the step of detecting the abnormal light-emission portion.

15. The method for manufacturing the light-emitting device according to claim 10,
　wherein a conductive foreign substance enters one of the plurality of EL layers.

16. The method for manufacturing the light-emitting device according to claim 10,
wherein the light-emitting device is an image display device.

17. The method for manufacturing the light-emitting device according to claim 10,
wherein the light-emitting device is a light source.

* * * * *